United States Patent [19]

Akimoto et al.

[11] Patent Number: 5,014,242

[45] Date of Patent: May 7, 1991

[54] SEMICONDUCTOR DEVICE FOR A RAM DISPOSED ON CHIP SO AS TO MINIMIZE DISTANCES OF SIGNAL PATHS BETWEEN THE LOGIC CIRCUITS AND MEMORY CIRCUIT

[75] Inventors: Kazuhiro Akimoto, Tokorozawa; Masami Usami, Tokyo; Katsumi Ogiue, Tokyo; Hiroshi Murayama, Hadano; Hitoshi Abe, Hadano; Masamori Kashiyama, Hadano; Yoshikuni Kobayashi, Tokyo; Satoru Isomura, Tokyo; Kinya Mitsumoto, Tokyo, all of Japan

[73] Assignees: Hitachi, Ltd.; Hitachi Microcomputer Engineering Ltd., both of Tokyo, Japan

[21] Appl. No.: 281,399

[22] Filed: Dec. 8, 1988

[30] Foreign Application Priority Data

Dec. 10, 1987 [JP] Japan .................. 62-313010
Dec. 29, 1987 [JP] Japan .................. 62-335998
Mar. 17, 1988 [JP] Japan .................. 63-64086

[51] Int. Cl.⁵ .............................................. G11C 5/02
[52] U.S. Cl. ........................................ 365/63; 365/51; 365/230.05
[58] Field of Search .............. 365/51, 63, 230.05, 365/230.03, 189.03, 189.08

[56] References Cited

U.S. PATENT DOCUMENTS

| | | | |
|---|---|---|---|
| 4,535,423 | 8/1985 | Nozaki et al. | 365/51 X |
| 4,660,174 | 4/1987 | Takemae et al. | 365/63 X |
| 4,695,978 | 9/1987 | Itakura | 365/51 X |
| 4,701,885 | 10/1987 | McElroy | 365/230.05 |
| 4,709,351 | 11/1987 | Kajigaya | 365/51 X |
| 4,712,192 | 12/1987 | Tanimura et al. | 365/51 X |
| 4,729,119 | 3/1988 | Dennison et al. | 365/63 |
| 4,775,942 | 10/1988 | Ferreri et al. | 365/51 |
| 4,791,607 | 12/1988 | Igarashi et al. | 365/63 |
| 4,796,224 | 1/1989 | Kawai et al. | 365/57 X |
| 4,819,209 | 4/1989 | Takemae et al. | 365/51 |

FOREIGN PATENT DOCUMENTS

| | | |
|---|---|---|
| 58-3188 | 1/1983 | Japan . |
| 59-101089 | 6/1984 | Japan . |
| 61-274339 | 12/1986 | Japan . |
| 61-296759 | 12/1986 | Japan . |
| 61-180607 | 8/1987 | Japan . |
| 60-202537 | 9/1987 | Japan . |
| 62-250583 | 10/1987 | Japan . |
| 62-284518 | 12/1987 | Japan . |

OTHER PUBLICATIONS

"Nikkei Electronics," Jun. 3, 1985, No. 370, pp. 151–177, published by Nikkei McGraw-Hill Company.
"Electronic Technique," pp. 32–39, published Nov. 1985.

Primary Examiner—Joseph A. Popek
Assistant Examiner—Alfonso Garcia
Attorney, Agent, or Firm—Antonelli, Terry, Stout & Kraus

[57] ABSTRACT

Disclosed is a semiconductor integrated circuit wherein a logic circuit for exchanging signals with RAMS, with the RAMS being disposed centrally on the semiconductor chip or substrate, is divided into a plurality of logic circuits in accordance with the kind of signals and the divided logic circuits are disposed around the RAM in such a manner as to minimize the distance of signal transmission paths with the RAM and in order to attain high speed access to RAMS.

15 Claims, 11 Drawing Sheets

MC00

SEMICONDUCTOR DEVICE FOR A RAM DISPOSED ON CHIP SO AS TO MINIMIZE DISTANCES OF SIGNAL PATHS BETWEEN THE LOGIC CIRCUITS AND MEMORY CIRCUIT

BACKGROUND OF THE INVENTION

This invention relates to a semiconductor integrated circuit device and to a technique which will be effective when applied, for example, to a full custom semiconductor integrated circuit device consisting of RAMS (Random Access Memories) and a logic circuit for controlling them.

A conventional semiconductor integrated circuit device with built-in RAMS in a gate array is disclosed, for example, in "Nikkei Electronics", June 3, 1985, No. 370, pp. 151 - 177, published by Nikkei McGrawHill Co., and "Electronic Technique", November, 1985, pp. 32-39.

In the semiconductor integrated device of the kind described above which incorporates RAMS in the gate array, a logic unit consisting of the gate arrays is disposed at the center of chip and RAMS are disposed around the logic unit to secure versatility of the gate arrays.

High speed accessibility of ultra-high speed memories (e.g. buffer storages, control storages, etc.) used as the peripheral devices of a central processing unit (CPU) in a general purpose large scale computer or of vector registers in a super computer has great significance for improving system performance. A conventional ultra-high speed memory includes RAM of a multi-bit structure requiring a high speed operation and a logic circuit for controlling RAM and they are composed of separate semiconductor integrated circuit devices, respectively. Therefore, there is an inevitable limit as to how much the operation speed can improved by thus reducing the signal propagation delay time in wirings connecting these semiconductor integrated circuit devices and by reducing the circuit delay in input/output buffers. Accordingly, attempts have been made to utilize the semiconductor integrated circuit device consisting of the logic circuit consisting of the gate array and RAM having the multi-bit structure, as described above.

Input signals such as address signals, write data and so forth that are inputted to a RAM of the multi-bit structure are received by an input latch circuit in accordance with a predetermined clock signal. This reduces skews between the input signals and the RAM can thereby operate at a high speed in synchronism with a system clock.

The input latch circuit described above consists of standard flip-flop circuits FF5–FF7 which in turn consist of gate arrays as typified by a data input latch circuit DL shown in FIG. 15 of the accompanying drawings. In the same way as in other standard logic circuits, these flip-flop circuits employ ECL series gates as the fundamental structure and are equipped with NOR gate circuits for receiving an inversion internal enable signal $\overline{en0}$ and an inversion timing signal $\overline{\phi 0}$, example, at their clock input terminals, respectively. When both of the inversion internal enable signal $\overline{en0}$ supplied from an enable shaping circuit ENT0, not shown, through clock amplifiers CA1, CA2 and CA3 and the inversion timing signal $\overline{\phi 0}$ supplied from a clock shaping circuit CPT0, not shown, through clock amplifiers CA4, CA5 and CA6 are at the low level, the data input latch circuit consisting of these flip-flop circuits FF5–FF7 receives the input data IND0–INDm and transmits them as complementary write data wrd0, $\overline{wrd0}$–$\overline{wrdm}$ to RAM.

SUMMARY OF THE INVENTION

As a result of their studies, the inventors of the present invention found out that the semiconductor integrated circuit device described above involves the following problems. In accordance with the prior art semiconductor integrated circuit device, the RAM unit and the logic unit are separated from each other in order to exclusively improve versatility and integration density. According to such a structure, the wiring path between the RAM unit and the logic unit becomes relatively elongated so that the operation speed cannot be much improved by only reducing the signal propagation delay time inside the semiconductor integrated circuit. Furthermore, the input data latch circuit in the semiconductor integrated circuit comprises the standard flip-flop circuits consisting of the gate array as described already. Therefore, if a semiconductor circuit containing a RAM of the multi-bit structure requiring a high operation speed is constituted by such a semiconductor integrated circuit, each bit of the input latch circuit disposed at the pre-stage of the RAM and inside the RAM includes individually a corresponding logic gate circuit for clock input although its status is shifted under the same logic condition. For this reason, the number of circuit devices of the input latch circuit increases with an increase in the layout area and the semiconductor substrate on which the semiconductor integrated circuit is formed becomes greater. Furthermore, the number of fan-outs for the control signals such as the inversion internal enable signal and the inversion timing signal $\overline{\phi 0}$ or the timing signal and a plurality of stages of clock amplifiers CA1–CA3 and CA4–CA6 that are required correspondingly increases. They increase further the number of circuit devices of the semiconductor integrated circuit causing skews between the respective clock signals which therefore limits the improvement in the high speed operation of the semiconductor integrated circuit.

It is therefore an object of the present invention to provide a semiconductor integrated circuit device which accomplishes high speed RAM access.

It is another object of the present invention to provide a semiconductor circuit device which reduces the number of circuit devices.

These and other objects and novel features of the present invention will become more apparent from the following detailed description thereof when taken in conjunction with the accompanying drawings.

Among the inventive aspects disclosed herein, the following will illustrate a typical example.

A logic circuit for exchanging signals with a memory circuit having a memory capacity of a plurality of bits with the memory circuit being disposed in the center, is divided into a plurality of logic circuits in accordance with the kind of signals and the divided logic circuits are disposed so that their signal transmission paths become the shortest (i.e. the corresponding signal path lengths become minimized).

A plurality of flip-flop circuit groups each consisting of a fundamental flip-flop circuit whose state is shifted simultaneously by a common timing signal and which do not contain a logic gate circuit for clock input are disposed on a semiconductor integrated circuit having a RAM mounted thereto, and the timing signal supplied to these flip-flop circuit groups is generated by a common timing control circuit disposed separately.

According to the means described above, the length of the signal transmission path can be made the shortest and the signal propagation delay time associated therewith can be reduced. Furthermore, the number of circuit devices disposed in the semiconductor integrated circuit such as an input latch circuit and the like can be reduced, the necessary layout area can be reduced and the skew between the timing signals supplied to the input latch circuits can be reduced so that higher speed access to RAM can be made.

DESCRIPTION OF THE PREFERRED EMBODIMENTS

Figure 1:
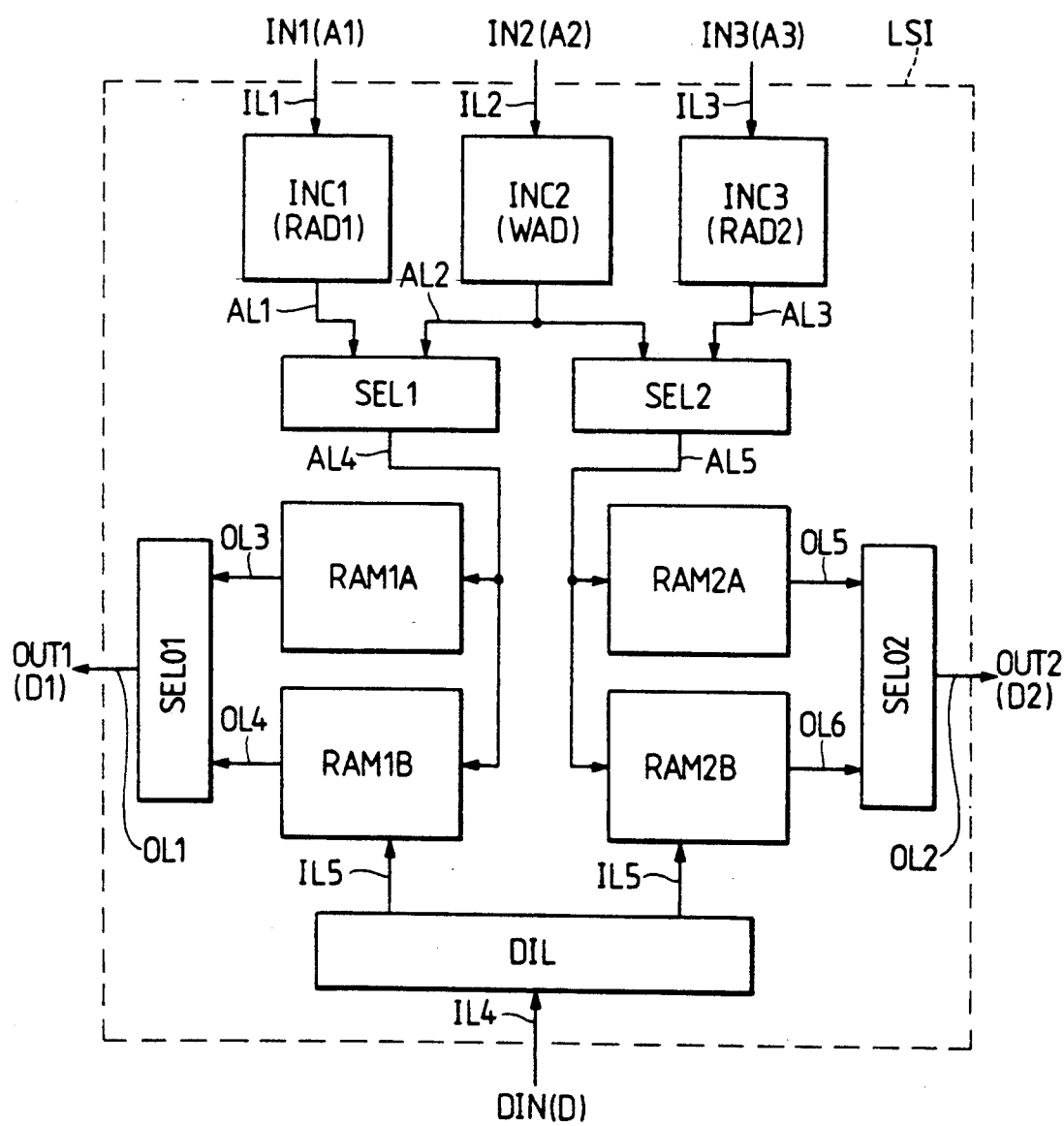
FIG. 1 is a block diagram showing one embodiment of the present invention when applied to a vector register.

FIG. 1 is a block diagram showing an embodiment of the present invention when it is applied to a vector register used in a super computer or the like.

In the diagram, the portion encompassed by the dash line constitutes one semiconductor integrated circuit device LSI, which is formed on one semiconductor substrate such as single crystal silicon by a known fabrication technique of semiconductor integrated circuitry, though not particularly limited thereto. Each circuit block in the diagram is depicted in a practical geometric arrangement in a the semiconductor integrated circuit device. Though only one signal line is shown disposed between the circuits in the drawing, a plurality of signal lines are used in practice as the signal lines.

In this embodiment the register function is accomplished by RAMs. RAMs consist of four RAMs in total, that is, two sets each of RAM1A, RAM1B and RAM2A, RAM2B. Each RAM 1A - 2B has a multi-bit structure. RAM1A and RAM1B forming one set and RAM2A and RAM2B forming the other set are disposed at horizontally symmetric positions. Each RAM of each set is aligned vertically. Accordingly, the address input terminals are arranged on the right side of RAM1A and RAM1B while they are arranged on the left side of RAM2A and RAM2B, on the contrary. In other words, address signal lines AL4 and AL5 extend vertically at the center portion between the two sets of RAMs. An address signal is supplied in common from a selector SEL1 through the address signal line AL4 to RAM1A and RAM1B, corresponding to one set of RAMs. Similarly, an address signal is supplied in common from a selector SEL2 through the address signal line AL5 to the other set of RAMs, i.e. RAM2A and RAM2B. Accordingly, the selectors SEL1 and SEL2 are arranged at horizontally symmetric positions above RAM1A and RAM2A.

Two increment circuits INC1 and INC2 are disposed above the selector SEL1 and supply the address signal through the address signal lines AL1 and AL2. Similarly, the two increment circuits INC2 and INC3 are disposed above the selector SEL2 and supply the address signal to the selector SEL2 through the address signal lines AL2 and AL3. Therefore, the increment circuit INC2 that supplies commonly the address signal to the two selectors SEL1 and SEL2 is disposed between the increment circuits INC1 and INC3, and the latter two circuits INC1 and INC3 are disposed at horizontally symmetric positions with the increment circuit INC2 being the center in registration with the disposition of the selectors SEL1 and SEL2, respectively.

An address increment signal A1 as the input signal is supplied to the increment circuit INC1 from the external terminal IN1 of the semiconductor integrated circuit device disposed thereabove through an input signal line IL1. The increment circuit INC1 is updated by the address increment signal A1 and generates the address signal RAD1 for reading data in RAM1A and RAM1B. The address increment signal A2 as the input signal is supplied from the external terminal IN2 of the semiconductor integrated circuit device disposed thereabove through the input signal line IL2. The increment circuit INC2 is updated by the address increment signal A2 and generates an address signal WAD for writing data in RAM1A, RAM1B and RAM2A, RAM2B. The address increment signal A3 as the input signal is supplied from the external terminal IN3 of the semiconductor integrated circuit device disposed thereabove through the input signal line IL3. The increment circuit INC3 is updated by the address increment signal A3 and generates the address signal RAD2 for reading data in RAM2A and RAM2B.

An output selector SEL01 is disposed on the left side of RAM1A and RAM1B that are disposed on the left side of the semiconductor integrated circuit device LSI. This selector receives a read signal for RAM1A and RAM1B through an output signal line OL3 and OL4 by a later-appearing output select signal $\overline{OS}$ and sends it selectively as the output data D1 to an external terminal OUT1 disposed on the left side of the semiconductor integrated circuit device LSI through a logic circuit not shown in the drawing. An output selector SEL02 is disposed on the right side of RAM2A and RAM2B disposed on the right side of the semiconductor integrated circuit device LSI. This output selector SEL02 receives read data for RAM2A and RAM2B by the later-appearing output select signal $\overline{OS}$ through the output signal lines OL5 and OL6 and sends it selectively as the output data D2 through the output signal line OL2 to the external terminal OUT2 disposed on the right side of the semiconductor integrated circuit device LSI through a logic circuit not shown in the drawing.

A data input latch circuit DIL is disposed at a lower part of the semiconductor integrated circuit device LSI below RAM1B and RAM2B. This data input latch circuit DIL receives write input data D from an external terminal DIN disposed at the lower part of the semiconductor integrated circuit device LSI through the input signal line IL4 and supplies the write signal to RAM1B, RAM1A and RAM2B, RAM2A through the input signal line IL5.

Though not particularly limited thereto, the write address signal WAD described above is supplied to RAM1A, RAM1B or RAM2A, RAM2B by the selectors SEL1 and SEL2 in accordance with a control signal, not shown in the drawing. Therefore, the write operation to RAM1A, RAM1B and RAM2A, RAM2B is made selectively to the two sets of the RAM's i.e. the set including RAM1A, RAM1B and the set including RAM2A, RAM2B. In contrast, the read address signal is supplied to each of the two sets of RAM1A, RAM1B and RAM2A, RAM2B. Accordingly, two sets of RAMs can be read out either selectively or simultaneously.

The output selectors SEL01 and SEL02 output selectively the read signals to the two RAMs, i.e., RAM1A and RAM1B and RAM2A and RAM2B, in each set in accordance with the later-appearing output select signal $\overline{OS}$. Vector calculation or the like can be made at a high speed by the access to these four RAMs in total. Since the operation mode itself for vector calculation is irrelevant to the subject matter of the present invention and since the function of the vector register itself is well known in the art of a super computer or the like, their detailed description will be hereby omitted.

In the semiconductor integrated circuit device LSI of this embodiment, the logic circuit is divided, as described above, in accordance with the kinds of signals supplied to the two sets of RAM's including the set RAM1A, RAM1B and the set RAM2A, RAM2B with these RAMs being disposed in the center of the LSI. The logic circuit for propagating the address signals among these signals is divided into the increment circuits INC1 to INC3 for receiving the address increment signal for reading and the address increment signal for writing and the selectors SEL1, SEL2 for receiving the output signals of the increment circuits INC1 ~ INC3 and transmitting them to the two sets of RAMs, that is, RAM1A, RAM1B and RAM2A, RAM2B. They are arranged in such a manner that the signal propagation path reaching the two sets of RAMs inclusive of the external terminals IN1 to IN3, corresponding to the respective signals, becomes the shortest. In other words, the signals from the address signal terminals disposed at the upper part of the semiconductor integrated circuit device LSI are transmitted from above to below to RAM1A, RAM1B and RAM2A, RAM2B through the increment circuits INC1 - INC3 and the selectors SEL1, SEL2. In this case, since the dispositions of the signal terminals of two sets of RAM's including the sets RAM1A, RAM1B and RAM2A, RAM2B which are horizontally symmetric, the address signal lines AL4 and AL5 are disposed in such a manner as to extend on the center between the two sets of RAMs. Accordingly, the output selectors SEL01 and SEL02 are disposed on the left side in connection with set RAM1A, RAM1B, disposed on the left side, and on the right side in connection with the set RAM2A, RAM2B, disposed on the right side, respectively. The read signal from RAM1A and RAM1B is sent out as the output data D1 from the output terminal OUT1 disposed on the left side of the semiconductor integrated circuit device LSI and the read signal from RAM2A, RAM2B is sent out as the output data D2 from the output terminal OUT2 disposed on the right side of the semiconductor integrated circuit device LSI. For this reason, the path of the read signal from RAMs can be made minimal.

The write signal path to RAM1A-RAM2B can extend through the data input latch circuit DL and the external terminal DIN that are disposed at the lower part of the semiconductor integrated circuit device. In the same way as described above, therefore, the write signal path to RAM1A - RAM2B can be made the shortest.

As described above, the logic circuits (increment circuits INC1-INC3, etc.) for making access to RAM1A-RAM2B are divided in accordance with the kind of signals to be transmitted by them and their arrangement is optimized so that the signal propagation path of each signal becomes the shortest with RAM1A-RAM2B being the center. Thus the access speed to RAM1A-RAM2B can be improved.

Figure 2:
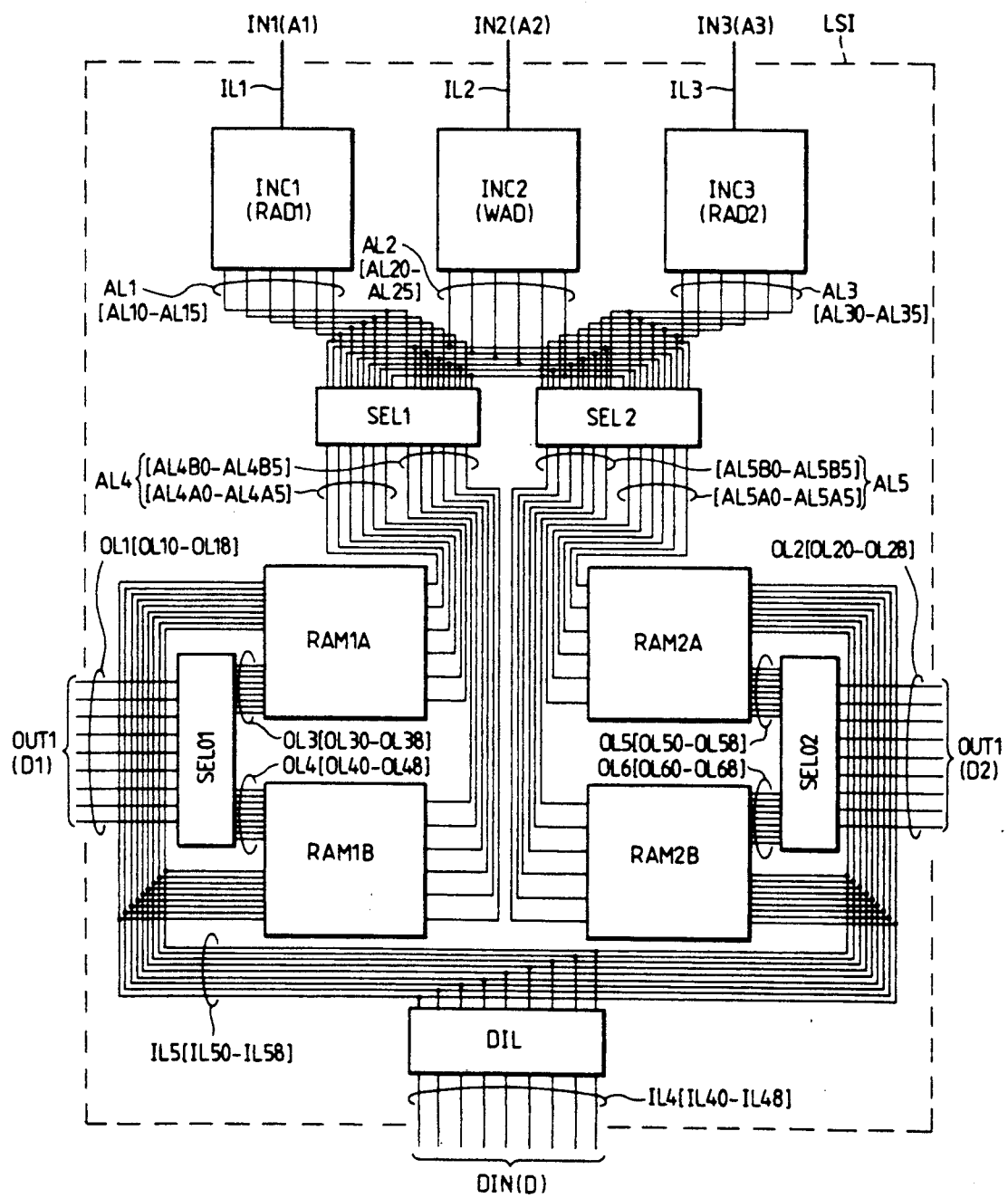
FIG. 2 is a layout diagram showing the detailed layout of the embodiment shown in FIG. 1.

FIG. 2 shows in detail an example of the layout of the embodiment shown in FIG. 1.

In FIG. 2, the portion encompassed by dash line represents a semiconductor integrated circuit which is formed on one semiconductor substrate such as single crystal silicon by a known fabrication technique of semiconductor integrated circuitry, though not particularly limited thereto, in the same way as in FIG. 1, and each signal line and each circuit block correspond to the practical geometric arrangement in the semiconductor integrated circuit Since the operation of each fundamental circuit block and its arrangement are the same as those of FIG. 1, their explanation will be hereby omitted.

In this embodiment each of RAM1A - RAM2B has a nine-bit structure while the address signal has a six-bit structure; hence each address signal line has the following structure. The address signal line AL1 consists of address signal lines AL10-AL15, and the address signal line AL2 consists of address signal lines AL20-AL25. The address signal line AL3 consists of address signal lines AL30 - AL35. The address signal lines AL4 and AL5 are disposed respectively for RAM1A, RAM1B and RAM2A, RAM2B in this embodiment. Therefore, the address signal line AL4 consists of address signal lines AL4A0-AL4A5, AL4B0-AL4B5 and the address signal line AL5 consists likewise of address signal lines AL5A0-AL5A5 and AL5B0-AL5B5. The output signal line OL1 consists of output signal lines OL10-OL18 and the output signal line OL2 consists of output signal lines OL20-OL28. The output signal line OL3 consists of output signal lines OL30-OL38 and the output signal line OL4 consists of output signal lines OL40-OL48. The output signal line OL5 consists of output signal lines OL50-OL58 and the output signal line OL6 consists of output signal lines OL60-OL68. The input signal line IL4 consists of input signal lines IL40-IL48 and the input signal line IL5 consists of input signal lines IL50-IL58.

In FIG. 2, the arrangement of RAM1A to RAM2B is the same as that of the first embodiment. In this embodiment, RAM1A and RAM1B are disposed symmetrically and RAM2A and RAM2B are disposed symmetrically. Therefore, the data input terminals of RAM1A to RAM2B are disposed on the left upper side, the left lower side, the right upper side and the right lower side of the respective blocks, respectively. The data output terminals of RAM1A to RAM2B are disposed on the left lower side, the left upper side, the right lower side and the right upper side of the respective blocks.

The address signal lines AL4A0-AL4A5, AL4B0-AL4B5 and AL5A0-AL5A5, AL5B0-AL5B5 for transmitting the address signals selected by the selectors SEL1 and SEL2 to the corresponding RAM1A, RAM1B and RAM2A, RAM2B are connected in the following manner. The address signal lines AL4A0-AL4A5 and AL4B0-AL4B5 are connected between the selector SEL1 and RAM1A and between the selector SEL1 and RAM1B, respectively. The address signal lines AL5A0-AL5A5 and AL5B0-AL5B5 AL5B5 are connected between the selector SEL2 and RAM2A and between the selector SEL2 and RAM2B, respectively. As described above, the address signal lines AL4A0-AL4A5, AL4B0-AL4B5, AL5A0-AL5A5 and AL5B0-AL5B5 are disposed so as to extend vertically through the center between the two sets of RAM's including RAM1A, RAM1B and RAM2A, RAM2B. The address signal lines AL4A0-AL4A5 and AL5A0-AL5A5 have substantially the same distance and the address signal lines AL4B0-AL4B5 and AL5B0-AL5B5 have substantially the same distance. However, there is the difference of distance between the address signal lines AL4A0-AL4A5, AL5A0-AL5A5 and AL4B0-AL4B5, AL5B0-AL5B5, and this difference is such that difference in the propagation time of the address signals is insignificant.

The address signal lines AL10-AL15, AL20-AL25 and AL30-AL35 for transmitting the read address signals RAD1 for RAM1A and RAM1B, the write address signal WAD for RAM1A-RAM2B and the read address signal RAD for RAM2A and RAM2B generated by the increment circuits INC1, INC2 and INC3, respectively, to the selectors SEL1 and SEL2 are connected and arranged in the following manner. The address signal lines AL10-AL15 and AL30-AL35 are connected between the increment circuit INC1 and the selector SEL1 and between the increment circuit INC3 and the selector SEL2 and are arranged substantially equidistantly. The address signal lines AL20-AL25 are connected and arranged between the increment circuit INC2 and the selector SEL1 and between the increment circuit INC and the selector SEL2. The signal lines AL20-AL25 between the increment circuit INC2 and the selector 1 and the address signal lines between the increment circuit INC2 and the selector SEL2 are arranged substantially equidistantly with respect to each other. The address signal lines AL10-AL15, AL30-AL35, the address signal lines AL20-AL25 between the increment circuit INC2 and the selector SEL1 and the address signal lines AL20-AL25 between the increment circuit INC2 and the selector SEL2 are arranged equidistantly. Each of the selectors SEL1 and SEL2 consists of unit selectors corresponding to RAM1A, RAM1B and RAM2A, RAM2B. In other words, each of the selectors SEL1 and SEL2 consists of two unit selectors. Therefore, two each corresponding address signal lines AL10-AL20-AL25, and AL20 -AL25, AL30-AL35 are connected. The two unit circuits contained in each of the selectors SEL1 and SEL2 are connected to the corresponding address signal lines AL4A0-AL4A5, AL4B0-AL4B5 and AL5A0-AL5A5, AL5B0-AL5B5.

The input signal lines IL1, IL2 and IL3 for transmitting the address increment signals A1, A2 and A3 to the increment circuits INC1, INC2 and INC3 are connected between the increment circuit INC1 and the external terminal IN1, between the increment circuit INC2 and the external terminal IN2 and between the increment circuit INC3 and the external terminal IN3, respectively, and are arranged in substantially the same distance with respect to one another.

The output signal lines OL30-OL38, OL40-OL48 and OL50-OL58, OL60-OL68 for transmitting the read signals of RAM1A, RAM1B and RAM2A, RAM2B to the output selectors SEL01 and SEL02 are connected between RAM1A and the output selector SEL01, between RAM1B and the output selector SEL01, between RAM2A and the output selector SEL02 and between RAM2B and the output selector SEL02 and are arranged in substantially the same distance.

The output signal lines OL10-OL18 and OL20-OL28 for transmitting the output data D1 and D2 outputted from the output selectors SEL01 and SEL02 to the output terminals OUT1 and OUT2, respectively, are arranged substantially in the same distance between the output selector SEL01 and the external terminal OUT1 and between the output selector SEL02 and the output terminal OUT2 and are connected therebetween.

The input signal lines IL50-IL58 for transmitting the write signal to the two sets of RAM1A, RAM1B and RAM2A, RAM2B are connected between RAM1A, RAM1B, RAM2A, RAM2B and the data input latch circuit DIL in the arrangement shown in the drawing. Since the later-appearing write signal is a complementary signal, i.e. in the form of a pair of complementary data signals, two input signal lines IL50-IL58 are shown disposed as one input signal line.

The input signal lines IL40-IL48 for transmitting the input data D to the data input latch circuit DIL are arranged substantially linearly between the data input latch circuit DIL and the external terminal DIN.

In accordance with the structure of the selectors SEL1, SEL2 the signal lines shown in FIG. 2, separate address signals, that is, the read address signal RAD1 and the write address signal WAD, can be applied simultaneously to RAM1A and RAM1B by using separate control signals as the control signal not shown. Similarly, the write address signal WAD and the read address signal RAD2 can be applied simultaneously to RAM2A and RAM2B. For example, the write and read operations can be made selectively to RAM1A, RAM2A and RAM1B, RAM2B.

Figure 3:
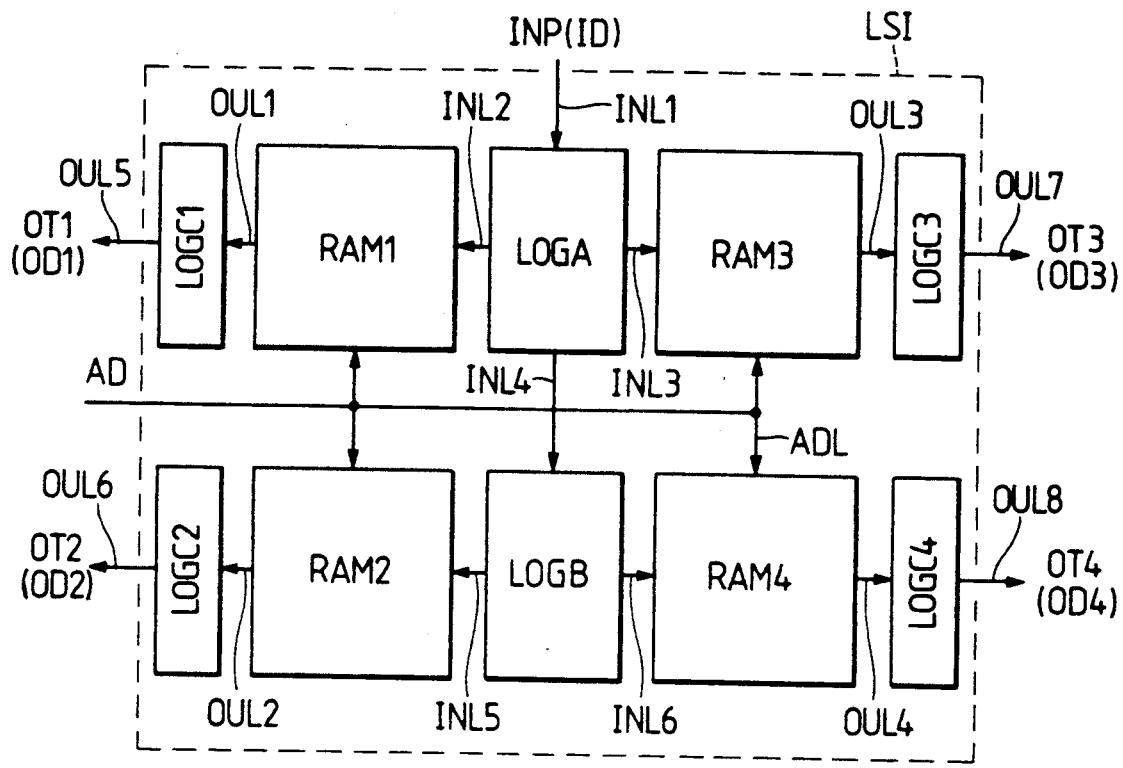
FIG. 3 is a block diagram showing another embodiment of the present invention when applied to a buffer register.

FIG. 3 is a block diagram showing another embodiment of the present invention when applied to a buffer storage which is used in a general-purpose large-scale computer, or the like.

The portion encircled by dash line in the drawing represents a semiconductor integrated circuit device LSI in the same way as in the foregoing embodiments. This LSI is formed on one semiconductor substrate such as single crystal silicon by a known semiconductor integrated circuitry fabrication technique, though this is not particularly limitative. Each circuit block in the drawing is depicted so as to be matching with the practical geometric disposition in the semiconductor integrated circuit device.

A plurality of logic circuits including LOGA and LOGB shown in the semiconductor integrated circuit and four RAMs, that is, RAM1-RAM4, are logic circuits employing an ECL series gate circuit consisting of bipolar transistors as their basic structure such as the one that is disclosed in Japanese Patent Laid-Open No.60487 /1983, for example, though this circuit arrangement is not particularly limited thereto, and static RAMs of a multi-bit structure using memory cells each consisting of a bipolar transistor as its basic structure.

In FIG. 3, the logic circuits LOGA and LOGB are aligned in the longitudinal direction at the center of the semiconductor integrated circuit device LSI. The logic circuit LOGA receives the write data ID and the like from the input terminal INP disposed at the upper part of the semiconductor circuit device LSI through the input signal line INL and supplies the write data ID and the control signal through the input signal line INL2 and INL3, respectively, to RAM1 and RAM3 that are disposed on the right and left of the logic circuit LOGA as the center. The control signal includes the selection signal for selecting RAM1 or RAM3 and the control signal representing the write/read operation. A substantial address signal for representing the selection of RAM1 or RAM3 is supplied with the control signal. The logic circuit LOGB receives the similar write data ID and the control signal through the logic circuit LOGA and the input signal line INL4. RAM2 and RAM4 are disposed on the right and left of the logic circuit LOGB as the center and the write data ID and the control signal are supplied to them through the input signal lines INL5 and INL6 in the same way as described above. The logic circuit is divided into the logic circuits LOGA and LOGB as described above so that the address signal line ADL for supplying the address signal AD to RAM3 and RAM4 can be extended in the transverse direction while crossing the center of the semiconductor integrated circuit device.

The address signal AD is supplied through the external terminal disposed at the center of the left side of the semiconductor integrated circuit device LSI, though this is not particularly limited thereto. To this end is disposed an address buffer, whenever necessary, though it is not shown in the drawing. If the space for the disposition of the address buffer cannot be secured easily on the left side of the semiconductor chip because the number of bits of the address signal AD is relatively large, the address terminal and the address signal line ADL may be disposed at the center on the right and left sides of the semiconductor integrated circuit device LSI by dividing the address signal AD to the two signals. The address input terminals of RAM allotted vertical with the wiring area, in which the address signal line ADL is disposed, being the center are disposed vertically symmetrically. In other words, the address input terminals of RAM1 and RAM3 disposed on the upper side are disposed at the lower part of the circuit blocks and the address signal line ADL disposed transversely in the area below the former extends upward and is connected to the corresponding address input terminals. On the contrary, the address input terminals of RAM2 and RAM4 disposed at the lower part are arranged on the upper side of the circuit blocks and the address signal line ADL disposed on the upper side of the area extends downward and is connected to the corresponding address input terminals.

In the structure described above where RAM1, RAM3 and RAM2, RAM4 are arranged on the right and left of the logic circuits LOGA and LOGB as the center, the signal terminals of corresponding RAM1 and RAM3 and those of corresponding RAM2 and RAM4 are disposed symmetrically. In other words, the data input terminal and the control input terminal are disposed on the right side of the circuit block of RAM1, RAM2 and the data input terminal and the control input terminal are disposed on the left side of the circuit block of RAM3, RAM4, on the contrary. The data output terminal is disposed on the left side of the circuit block of RAM1, RAM2 and the data output terminal is disposed on the right side of the circuit block of RAM3, RAM4, on the contrary.

The data output terminal is disposed on the left side of the circuit block of RAM1, RAM2 located on the left side of the layout and the output logic circuits LOGC1, LOGC2 are disposed in such a manner as to correspond to these RAMs, respectively. Data output terminals OT1, OT2 are disposed longitudinally on the left side of the output logic circuits LOGC1 and LOGC2, or on the left side of the semiconductor integrated circuit device LSI, in such a manner as to correspond to the output logic circuits. On the contrary, the data output terminals are disposed on the right side of the circuit blocks of RAM3, RAM4 located on the right side of the layout and output logic circuits LOGC3, LOGC4 are disposed so as to correspond to them. The corresponding data output terminals OT3, OT4 are disposed longitudinally on the right side of the semiconductor integrated circuit device LSI so as to correspond to the output logic circuits.

In this buffer storage, the input signal supplied from the input terminal INP to each logic circuit LOGA, LOGB to let it generate a selection signal for selecting each RAM (block select signal) and a write or read instruction of the data IA supplied from the input terminal INP is given.

Though not particularly limitative, the output logic circuits LOGC1-LOGC4 disposed so as to correspond to RAM1-RAM4, respectively, output selectively either the read data supplied from the designated address of the corresponding RAM1 to RAM4 through the output signal lines OUL1-OUL4 or the write data supplied from the input terminal INP, as the output data OD1-OD4 through the output signal lines OUL5-OUL8. To provide such a function, the write data outputted from the logic circuits LOGA and LOGB are transmitted to the corresponding output logic circuits LOGC1-LOGC4 through the wiring area where the output signal lines OUL1-OUL4 extending to respective RAM1-RAM4 or the address signal AD at the center is formed.

In the buffer storage of this embodiment, too, the logic circuits are divided as described above in accordance with the kind of signals applied to RAMs with these RAMs being the center. Propagation of the address signal among these signals is made by the address signal line AD extending transversely through the center of the semiconductor integrated circuit device and RAMs are divided vertically with this address signal line AD being the center. The control signal and the write data are supplied from the center at the upper part of the semiconductor integrated circuit device LSI and the corresponding logic circuits LOGA and LOGB are disposed dividedly in the vertical direction. RAMs are disposed on the right and left of these logic circuits LOGA, LOGB as the center so that the write data and the control signal from the input terminals INP disposed at the upper part of the integrated circuit device LSI are transmitted to RAM1-RAM4 in the shortest distance through each logic circuit LOGA, LOGB. Since the output logic circuits LOGC1-LOGC4 are disposed on the left side of RAM1 and RAM2 and on the right side of RAM3 and RAM4, respectively, as described above, the RAM read signal terminals can make the read signal path the shortest.

As described above, this embodiment can attain the high speed access of RAM1-RAM4 by dividing the logic circuits (LOGA, LOGB, etc.) for making access to RAM1-RAM4 in accordance with the kind of signals to be transmitted and optimizing their disposition with RAM1-RAM4 being the center so as to make the signal propagation path of each signal the shortest.

Figure 4:
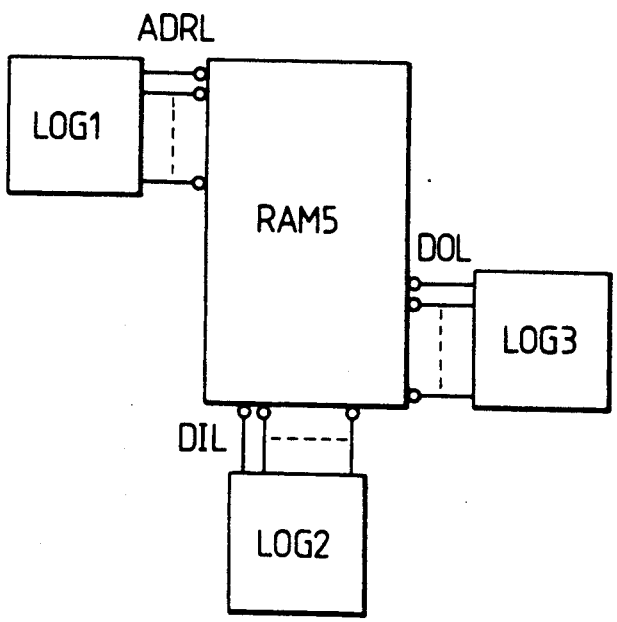
FIG. 4 is a block diagram showing a general layout of the present invention.

FIG. 4 is a block diagram showing generically an example of the optimal arrangement of logic circuits for a RAM incorporated in a semiconductor integrated circuit device.

For example, the address input terminal is disposed on the left side of the circuit block constituting RAM5. (It should be hereby noted that the term "terminal" used herein does not mean that a geometric terminal is disposed on the semiconductor chip but does mean that an address input signal line exists, and this definition will hold true of the following description, too.) The logic circuit LOG1 for supplying the address signal to the address input terminal is disposed as one independent circuit block in such a manner as to correspond to the input terminal.

If the data input terminal DIL is disposed below the circuit block constituting RAM described above, the logic circuit LOG2 generating the write data is disposed as one independent block so as to correspond to the same. If the data output terminal DOL is disposed on the right side of the circuit block constituting RAM described above, the logic circuit LOG3 generating the read data is disposed as one independent circuit block so as to correspond to the same. In this manner each circuit block is divided in match with the signal lines as the terminals of RAM5 and is disposed in the shortest distance. Since the propagation distance of the signals necessary for the access to RAM5 can be made minimal in this manner, the high speed access of RAM5 can be accomplished.

Figure 5:
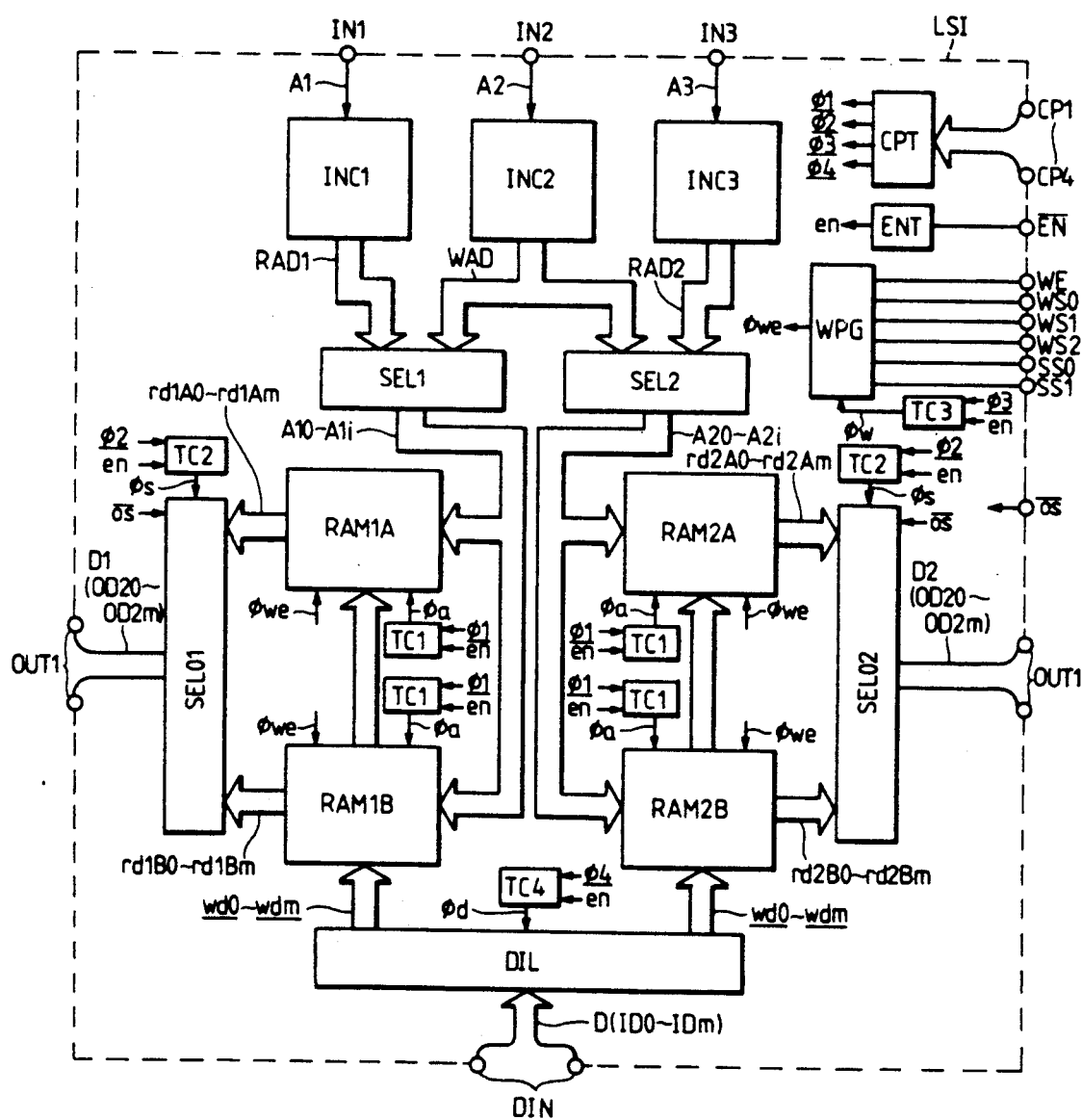
FIG. 5 is a block diagram showing an embodiment when control signals and the like are applied to the embodiment shown in FIG. 1.

FIG. 5 is a block diagram showing in further detail another embodiment of the present invention wherein a plurality of control signals are applied to the embodiment of the invention shown in FIG. 1.

In FIG. 5, like reference numerals are used to identify like circuit blocks as in FIG. 1 but each signal line name is omitted and instead each signal name is put. Hereinafter, the circuits which are added afresh to the circuits of FIG. 1 will be explained primarily.

A plurality of logic circuits such as the increment circuits INC1-INC3 shown disposed in the semiconductor integrated circuit LSI of this embodiment and four RAM1A-RAM2B are those logic circuits which employ the ECL series gate circuit consisting of bipolar transistors as the basic structure and are four static RAMs using memory cells consisting primarily of bipolar transistors as the basic structure as disclosed, for example, in Japanese Patent Laid-Open No.60487/1983, though the circuit arrangement is not particularly limitative. The data input latch circuit DIL and the address latch circuit ABL contained in each of the later appearing RA1A - RAM2B include a plurality of flip-flop circuit groups consisting of basic flip-flop circuits the state of which is shifted simultaneously in accordance with a common timing signal and which do not contain any logic gate circuit for a clock input, in addition to the standard logic gate circuits and flip-flop circuits.

The semiconductor integrated circuit device LSI of this embodiment includes further timing control circuits TC1-TC4 for generating timing signals to be supplied to the flip-flop group described above in accordance with a predetermined control signal and a write pulse generation circuit WPG for generating a write pulse or timing signal $\phi we$ supplied selectively to a gate circuit, not shown, to a write amplifier WA contained in each RAM1A-TAM2B as will be described later.

The write pulse or timing signal $\phi we$ must have a predetermined set-up time with respect to the address signal and the input data and must have a predetermined pulse width so that the write amplifier WA can operate stably. Therefore, a predetermined set-up time and pulse width have been obtained conventionally by synchronizing the input operations of RAM1A-RAM2B by the clock signal and switching selectively the input operations by changing a fabrication mask of a plurality of delay circuits contained in the pulse generation circuit WPG on the basis of the clock signal described above. In the pulse generation circuit of this embodiment, however, the delay circuit contained therein consists of a plurality of unit delay circuits connected in series and the write pulse generation circuit includes further an output selection circuit for transmitting selectively the output signals of these unit delay circuits in accordance with a select signal and a decoder for generating alternatively the select signal described above by decoding a predetermined select control signal.

Though not limitative, the clock signal CP1-CP4, as enable signal $\overline{EN}$, address increment signals A1-A3, the input data D, the output select signal $\overline{OS}$ and a write enable signal WE are supplied to the semiconductor integrated circuit device LSI of this embodiment from an external memory control unit not shown in the drawing, and pulse width select signals WS0-WS2 and set-up signals SS0, SS1 are supplied thereto from the external terminals.

As described above, each RAM1A - RAM2B has the multi-bit structure. Therefore, each signal has the following multi-bit structure. Each output data D1, D2 consists of OD10-OD1m, OD20-OD2m. Each read data of RAM1A-RAM2B consists of rd1A0~rd1Am-rd2B0~rd2Bm. Complementary write data supplied in common to RAM1A-RAM2B consist of wd0-wdm. (Here, non-inversion write data wd0 and the inversion write data $\overline{wd0}$ are altogether expressed as the complementary write data wd0; hereinafter the complementary signals will be expressed by putting the underline in the same way.) The read address signals RAD1, RAD2 and the write address signal WAD have the multi-bit structure as described already. Therefore, the address signals supplied to RAM1A, RAM1B through the selector SEL1 and the address signals supplied to RAM2A, RAM2B through the selector SEL2 will be expressed as the address signals A10 - A1i and A20-A2i, respectively.

Though not particularly limitative, the clock signals CP1-CP4 supplied from outside are inputted to a clock shaping circuit CPT to shape its waveform and pulse width. The output signal of the clock shaping circuit CPT are supplied to timing control circuits TC1-TC4 corresponding to complementary internal clock signals $\overline{\phi1}-\overline{\phi4}$ as the complementary internal clock signals $\overline{\phi1}-\overline{\phi4}$ and are also supplied to RAM1A-RAM2B, the increment circuits INC1-INC3 and the selectors SEL-1-SEL2, though not shown in the drawing.

—Similarly, the enable signal $\overline{EN}$ supplied from outside is inputted to an enable shaping circuit ENT to correct its shape and pulse width. The output signal of the enable shaping circuit ENT is supplied as an internal enable signal en to the timing control circuits TC1-TC4 and is also supplied to RAM1A-RAM2B and to increment circuits INC1-INC3 and selectors SEL1-SEL2, though not shown in the drawing.

On the other hand, the address increment signals A1-A3 and input data ID0-IDm supplied from outside are inputted to the increment circuits INC1-INC3 and to the data input latch circuit DIL as described above, respectively, and the output select signal $\overline{OS}$, the write enable signal, WE the pulse width select signals WS0-WS2 and set-up time select signals SS0-SS1 are inputted to the corresponding output selectors SEL01-SEL02 and the write pulse generation circuit WPG.

FIG. 5, each of RAM1A-RAM2B includes an address latch circuit ABL as will be described later and this address latch circuit ABL consists of a fundamental flip-flop circuit. The address latch circuit ABL receives and latches the address signal A10-A1i or A20-A2i selected by the selector SEL1 or SEL2 in accordance with the timing signal $\phi a$ supplied from the timing control circuit TC1. Similarly, the output selectors SEL01 and SEL02 receive and latch the output select signal $\overline{OS}$ in accordance with the timing signal $\phi s$ supplied from the timing control circuit TC2. The write pulse generation circuit WPG receives and latches the write enable signal WE in accordance with the timing signal $\phi w$ supplied from the timing control circuit TC3. The output signal $\phi we$ of the write pulse generation circuit WPG is selectively supplied as the write pulse, that is, the timing signal $\phi we$, to RAM1A-RAM2B by a later-appearing gate circuit not shown in the drawing. The data input latch circuit DIL receives and latches the input data ID0-IDm described above in accordance with the timing signal $\phi d$ supplied from the timing control circuit TC4. The output signal of the data input latch circuit DTL is supplied as the complementary input write data $\overline{wd0}-\overline{wdm}$ to RAM1A-RAM2B.

The timing signals $\phi a$, $\phi s$, $\phi w$ and $\phi d$ are generated in accordance with the corresponding complementary internal clock signals $\overline{\phi1}-\overline{\phi4}$, though not particularly limitative. Accordingly, the address signals A10-A1i or A20-A2i, the output select signal $\overline{OS}$, the input data ID0- IDm and the write enable signal WE are synchronized with the system clock signals CP1-CP4, respectively and each logic circuit and RAM1A-RAM2B are operated synchronously in accordance with these clock signals.

The write pulse generation circuit WPG described above generates autonomously a write pulse having a predetermined set-up time and pulse width, that is, the timing signal $\phi we$, in accordance with the clock signal $\phi w$ and write enable signal WE supplied thereto from the timing control circuit TC3 and supplies it selectively to the write amplifier WA contained in each of RAM1A-RAM2B through the gate circuit not shown. The gate circuit is the circuit which supplies selectively the timing signal $\phi we$ to RAM1A-RAM2B which is under the write operation. In other words, the write operation is carried out selectively in RAM1A, RAM1B or RAM2A, RAM2B as explained with reference to FIG. 1. In this embodiment the timing signal $\phi we$ is supplied selectively to RAM1A, RAM1B or RAM2A, RAM2B by use of the gate circuit described above.

The write pulse generation circuit WPG described above includes two sets of delay circuits DL1, DL2 each consisting of a plurality of unit delay circuits connected in series and delay select circuits DSEL1, DSEL2 for transmitting selectively the output signal of each unit delay circuit in accordance with the select signal w0-w7 or s0-s3. The write pulse generation circuit includes further decoders DEC1, DEC2 for decoding the select control signals supplied through the external terminals, that is, the pulse width select signal WS0-WS2 and the set-up time select signal SS0, SS1 and generating the select signal w0-w7 and s0-s3 described above. Accordingly, the delay time of the delay circuit DL1, DL2 contained in the write pulse generation circuit in the semiconductor integrated circuit device LSI can be adjusted without the necessity for changing the mask after the half-product or finished product of the device LSI is completed, and its pulse width and set-up time can be optimized.

The definite construction and operation of each of the data input latch circuit DIL, RAM1A-RAM2B, the timing control circuits TC1-TC4 and the write pulse generation circuit WPG will be described in detail later.

Figure 6:
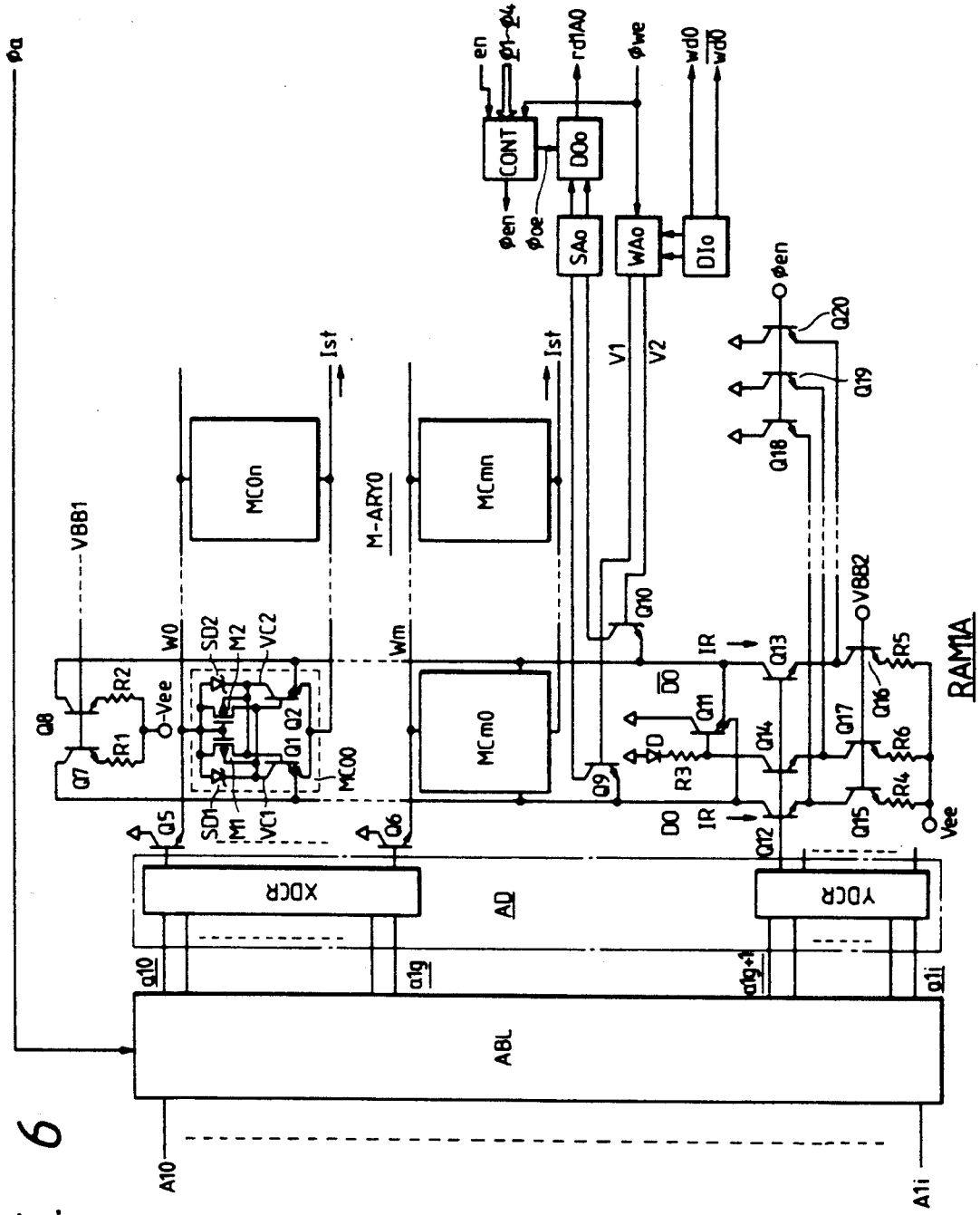
FIG. 6 is a circuit diagram showing one example of RAM 1A shown in FIG. 5.

FIG. 6 is a circuit diagram showing an example of RAM1A shown in FIG. 5. The other RAMs, i.e. RAM1B, RAM2A and RAM2B, have the same construction. Incidentally, the timing signals $\phi a$, $\phi we$, the complementary internal clock signals $\overline{\phi1}-\overline{\phi4}$ and the internal enable signal en are supplied also to RAM-1-RAM5 shown in FIGS. 3 and 4 and their construction is the same as that of RA1A of this embodiment.

The bipolar transistors shown in the following drawings are all of an NPN type.

In FIG. 6, a memory array unit circuit M-ARYo, a sense amplifier unit circuit SAo, a write amplifier unit circuit WAo, a data input unit circuit DIo and a data output unit circuit DOo are shown as the representatives of the unit circuits of RAM1A of this embodiment, but RAM1A consists, in practice, of m+1 corresponding unit circuits, i.e. memory arrays M-ARY, sense amplifiers SA, write amplifiers WA, data input circuits DI and data output circuits DO. The other unit circuits have the same construction. The output signal of the address decoder AD and the timing signal $\phi oe$ from the control circuit CONT are supplied in common to the other unit circuits M-ARYo+1-M-ARYm of the memory array M-ARY. Therefore, the read and write operation of a multi-bit structure can be made from and to RAM1A.

Though not particularly limitative, the memory cell of this embodiment uses a flip-flop circuit consisting of driving NPN transistors Q1, Q2 whose base-collector paths are cross-connected with each other, P-channel load MOSFETs M2, M1 connected to the collectors of these driving transistors and clamp Schottky diodes SD1, SD2 connected in parallel with these load MOSFETs M1, M2 as shown typically in the circuit diagram of one memory cell MC00 in order to reduce the drop of the hold voltage with respect to a read current IR which is set to a relatively large current value for the purpose of a high speed operation. In order to let the load MOSFETs M1 and M2 operate as variable resistance devices, their substrate gates, that is, their channel (back-gate) regions, are connected to the collectors of the other transistors Q1, Q2, respectively.

In other words, the load corresponding to the transistor Q1 is the load MOSFET M2 connected to its collector and its substrate gate is connected to the collector of the transistor Q2. Similarly, the load corresponding to the transistor Q2 is the load MOSFET M1 connected to its collector and its substrate gate is connected to the collector of the transistor Q1. The P-channel MOSFETs M1 and M2 are operated in substantially the depletion mode because a P-type impurity having opposite conductivity type to the substrate is selectively introduced into their channel regions.

The NPN transistors Q1, Q2 described above have a multi-emitter structure though it is not particularly limitative. One of the emitters of each transistor Q1, Q2 is connected in common to that of the other transistor and to a constant current source (not shown) for generating a later-appearing hold current Ist. The other emitter of each transistor Q1, Q2 is used as the input/output terminal of the memory cell and is connected to a pair of complementary data lines (bit lines or digit lines) D0, $\overline{D0}$ that are shown as representatives. Each of the driving NPN transistors Q1, Q2 may consist of two transistors whose bases and collectors are connected in common.

The gates and sources of the load MOSFETs M1, M2 and the anodes of the Schottky diodes SD1, SD2 constituting the memory cell are connected in common and to the word line W0 which is shown as the representative. Similar n+1 memory cells are disposed in the transverse row with the memory cell as the representative being the center (only one memory cell MC0n is shown in the black box) and are connected to the word line W0 described above. A current hold line corresponding to the word line W0 is disposed in this transverse row and is connected in common to the emitters of the driving transistors (Q1, Q2, etc.) of each memory cell that are connected in common. Similarly, memory cells MCm0-MCmm are disposed in other rows (word lines Wm) shown as representatives. In the longitudinal column, on the other hand, m+1 similar memory cells are disposed and their input/output terminals are connected in common to the complementary data lines D0, $\overline{D0}$. These (n+1) × (m+1) memory cells are disposed in matrix to constitute the memory array unit circuit M-ARYo.

In the data hold state of the memory cell having the structure described above, if the transistor Q1 is ON while the transistor Q2 is OFF in accordance with a very small hold current Ist, for example, the collector hold voltage VC1 of the transistor Q1 is at the low level while the collector hold voltage VC2 of the transistor Q2 is at the high level. MOSFET M2 is turned OFF when the high level of the hold voltage VC2 is supplied as the back-bias voltage to the back-gate, or when the potential difference between its source and the back-gate is substantially zero (0), and comes to possess a relatively large resistance value. Accordingly, the low level of the hold voltage VC1 at the collector of the transistor Q1 is determined by the voltage drop by the very small current Ist flowing to MOSFET M2 having a relatively large resistance value through the transistor Q1 described above. When this voltage drop becomes greater than the forward voltage of the Schottky diode SD1, the Schottky diode SD1 is turned ON and makes its level clamp. On the other hand, the MOSFET M1 is turned ON when the low level back-bias voltage is supplied to its source and transmits the high level in accordance with the potential Vx of the word line to the collector of the transistor Q1 described above.

This also holds true of the case where a read current of a relatively large current value IR is caused to flow and even when a relatively large base current corresponding to the read current IR flows through MOSFET M1, its resistance value is made to be relatively small so that the drop of the high level of the hold voltage VC2 can be reduced. Therefore, the D.C. characteristics of the hold voltages VC1 and VC2 of the memory cell can limit the drop of the hold voltage VC2 on the high level side even when the read current IR is increased.

Since the ratio of the read current IR to the hold current Ist can be set to a drastically large value, the read and write operations can be sped up while securing low power consumption under the hold state and a desired operation margin.

The word lines W0, Wm described above that are illustrated as the representatives are set to the selection/non-selection level by driving transistors Q5, Q6 of an emitter follower type which receive a select signal generated by an X address decoder XDCR, though this is not particularly limitative. In order to increase the driving capacity, these transistors Q5, Q6 may be composed of two transistors connected in the Darlington arrangement.

The detailed circuit diagram of the address latch circuit ABL is the same as that of the data latch circuit DL shown in later-appearing FIG. 8. In other words, it includes a plurality of flip-flop circuit groups consisting of fundamental flip-flop circuits. The address latch circuit ABL receives and latches the address signals A10 - A1i supplied from the increment circuit INC1 or INC2 through the selector SEL1 in accordance with the timing signal $\phi$a supplied from the timing control circuit TC1, and supplies the complementary internal address signals $\overline{A10\text{-}Alg}$ and $\overline{Alg+1\text{-}A1i}$ to the X decoder XDCR and to the Y decoder YDCR, respectively. The complementary internal address signals a10–alg and alg+1–ali supplied from the address latch $\overline{\text{circuit}}$ ABL are transmitted to the X address decoder XDCR and Y address decoder YDCR in the address decoder AD, respectively. In other words, in RAM of this embodiment, the address buffer is omitted and the address signal is supplied directly from the aforementioned address latch circuit ADL so that the high speed operation can be attained.

The X address decoder XDCR generates the select signal of one word line on the basis of the complementary internal address signals a10–alg supplied from the address latch circuit ABL and selects that word line.

The complementary data lines D0, $\overline{D0}$ shown as the representatives are connected to a constant current source for reading/writing disposed in common also for the other complementary data lines not shown, through transistors Q12, Q13 as a column switch. Though not particularly limitative, this constant current source consists of transistors Q15, Q16 that receive a constant voltage VBB2 at their bases and are equipped at their emitters with resistors R4 and R5, respectively. The output signal of a later-appearing Y address decoder YDCR is applied to the bases of the transistors Q12, Q13 as the column switch. The transistors as a plurality of sets of column switches are turned ON in accordance with the read or write bit number by the output signal of the Y address decoder YDCR. As described above, the transistors as the switch are turned ON on the basis of the complementary internal address signals $\overline{Alg+1-A1i}$ supplied from the address latch circuit $\overline{ADL}$ to select a plurality of sets of data lines.

\This embodiment includes the following bias circuit in order to apply a predetermined bias voltage to the data lines at the time of non-selection, though this is not particularly limitative. In other words, the collector of the NPN transistor Q11 is connected to the ground potential of the circuit. A series circuit of a diode D and a resistor R3 is disposed between the base and collector of this transistor Q11. The series circuit of the diode D and the resistor R3 is connected to the constant current source (Q17, R6) similar to the one described above through a transistor Q14 similar to the column switch transistor described above. Though not particularly limitative, the transistor Q11 has a multi-emitter structure and its pair of emitters are connected to the complementary data lines D0, $\overline{D0}$, respectively. These complementary data lines D0, $\overline{D0}$ are connected to very small constant current sources, respectively. In other words, the NPN transistors Q7, Q8 which receive the constant voltage VBB1 at their bases and which are equipped at their emitters with the resistors R1, R2, respectively, always suck the very small constant current for the complementary data lines D0, $\overline{D0}$.

Accordingly, the column switch transistor Q14 and the like are OFF in the non-selected complementary data lines and its potential is biased to the voltage which is approximately the sum of the forward voltage of the diode D and the base-emitter voltage of the transistor Q11. Incidentally, when the complementary data lines D0, $\overline{D0}$ are selected, the transistor Q14 described above is turned ON. Therefore, a relatively large current flows through the resistor R3 via the transistor Q14 from the constant current source. Accordingly, the transistor Q11 is turned OFF and the complementary data lines D0, $\overline{D0}$ are set to the potential which corresponds to the stored data of the selected memory cell.

Emitter-coupled current switch transistors Q9 and Q10 are disposed in the complementary data lines D0, $\overline{D0}$ in order to write/read the memory cell of the column shown as the representative. The collector outputs of these transistors Q9, Q10 are transmitted to a pair of inputs of the sense amplifier unit circuit SAo, which make the amplification of the collector outputs. The data output unit circuit DOo amplifies the output signal from the sense amplifier unit circuit SAo and sends the read data rdIAo to the afore-mentioned output selector SEL01.

The output voltages V1, V2 of the write amplifier unit circuit WAo are applied to the bases of the current switch transistors Q9, Q10, respectively. The complementary internal write data wro generated by the aforementioned data input buffer $\overline{DIB}$ is supplied to the input to the data input unit circuit DIo. The write data signal $\overline{wdo}$ is transmitted by this data input unit circuit DIo to the write amplifier unit circuit WAo.

Though not particularly limitative, the control circuit CONT judges the operation mode in accordance with the internal enable signal en supplied from the aforementioned enable shaping circuit, the complementary internal clock signals $\phi1$ - $\phi4$ from the clock shaping circuit CPT and the write pulse supplied from the aforementioned write pulse generation circuit WPG through the gate circuit not shown, that is, the timing signal $\phi$we, and generates the timing control signal $\phi$oe for the data output unit circuit DOo in accordance with the operation mode thus judged.

When the signal $\phi$we is at the low level and the internal enable signal en is at the high level, the data output unit circuit DOo is made operative, for example. At this time the write amplifier unit circuit WAo generates a read reference voltage Vrefc (V1, V2) set to an intermediate level of the hold voltage of the selected memory cell and transmits it to the bases of the transistors Q9 and Q10. In this operation mode the data output unit circuit DOo receives the amplification signal from the sense amplifier unit circuit SAo and generates its output signal.

When the write pulse signal $\phi$we is at the high level, the write amplifier unit circuit WAo generates the write high and low level signals in accordance with the complementary internal write data signal $\overline{wdo}$ supplied from the data input latch circuit DIL through the unit data input circuit DIo which is rendered operative at this time, and transmits them to the bases of the transistors Q9, Q10. Though not particularly limitative, the write high and low level signals (V1, V2) are set to the level higher than the high level of the hold voltage of the memory cell under the selection state but to the low level lower than the hold voltage. Accordingly, the driving transistors of the selected memory cell are turned ON and OFF in accordance with the write signals described above.

Under the non-selection state of RAM1A where the internal enable signal en is at the low level, the control circuit CONT described above sets the select signal $\phi$en to a level higher than the level of the select signal of the Y address decoder YDCR. This select signal $\phi$en is used in order to inhibit the flow of a constant current for write/read operation through the memory cells of all the memory array unit circuits M-ARY0–M-ARYm under the non-selection state of RAM1A. In other words, the current is supplied to the bases of transistors Q18–Q20 for bypassing the constant current generated by constant current source disposed in common for each complementary data line, though this is not particularly limitative. The collectors of these transistors Q18–Q20 are coupled to the ground potential of the circuit, while their emitters are connected to the collectors of transistors Q15–Q17 forming the constant current sources described above, respectively. Accordingly, these transistors Q18–Q20 have a differential form with the column switch transistors Q12–Q14 and cause the currents of the constant current sources to flow selectively in accordance with the level of the select signal $\phi$en described above. Incidentally, in the write/read mode where the internal enable signal en is at the high level, the select signal $\phi$en is set to a level lower than that of the select signal generated by the Y address decoder YDCR. Since the level of the select signal $\phi$en is at the lower level than the select signal generated by the Y address decoder YDCR in the selection state of RAM1A, the transistors Q18–Q20 are turned OFF.

Figure 7:
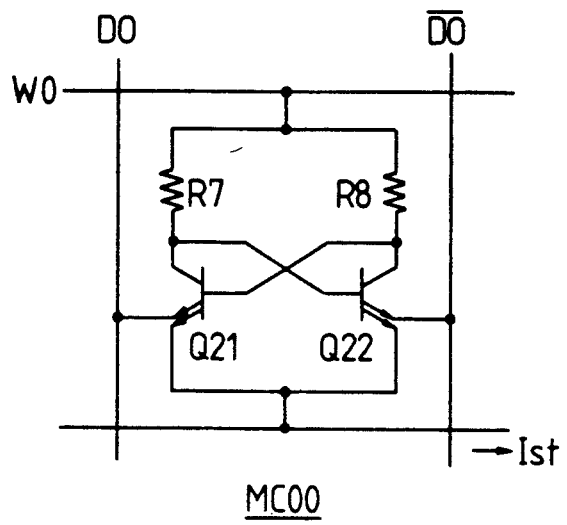
FIG. 7 is a circuit diagram showing another example of a memory cell contained in RAM 1A shown in FIG. 6.

FIG. 7 is a circuit diagram showing another example of the memory cell MC00 shown in FIG. 6.

In FIG. 7, the memory cell MC00 includes NPN transistors Q21, Q22 having a multi-emitter structure and load resistors R7, R8. The collectors of these transistors Q21, Q22 are connected in common to the common word line Wo described already through the corresponding load resistors R7, R8, respectively. The bases of the transistors Q21, Q22 are mutually connected. One of the emitters of each transistor Q21, Q22 is connected to the corresponding complementary data line D0, $\overline{D0}$ while the other emitter is connected in common to the constant current source (not shown) that generates the hold current Ist described already.

Figure 8:
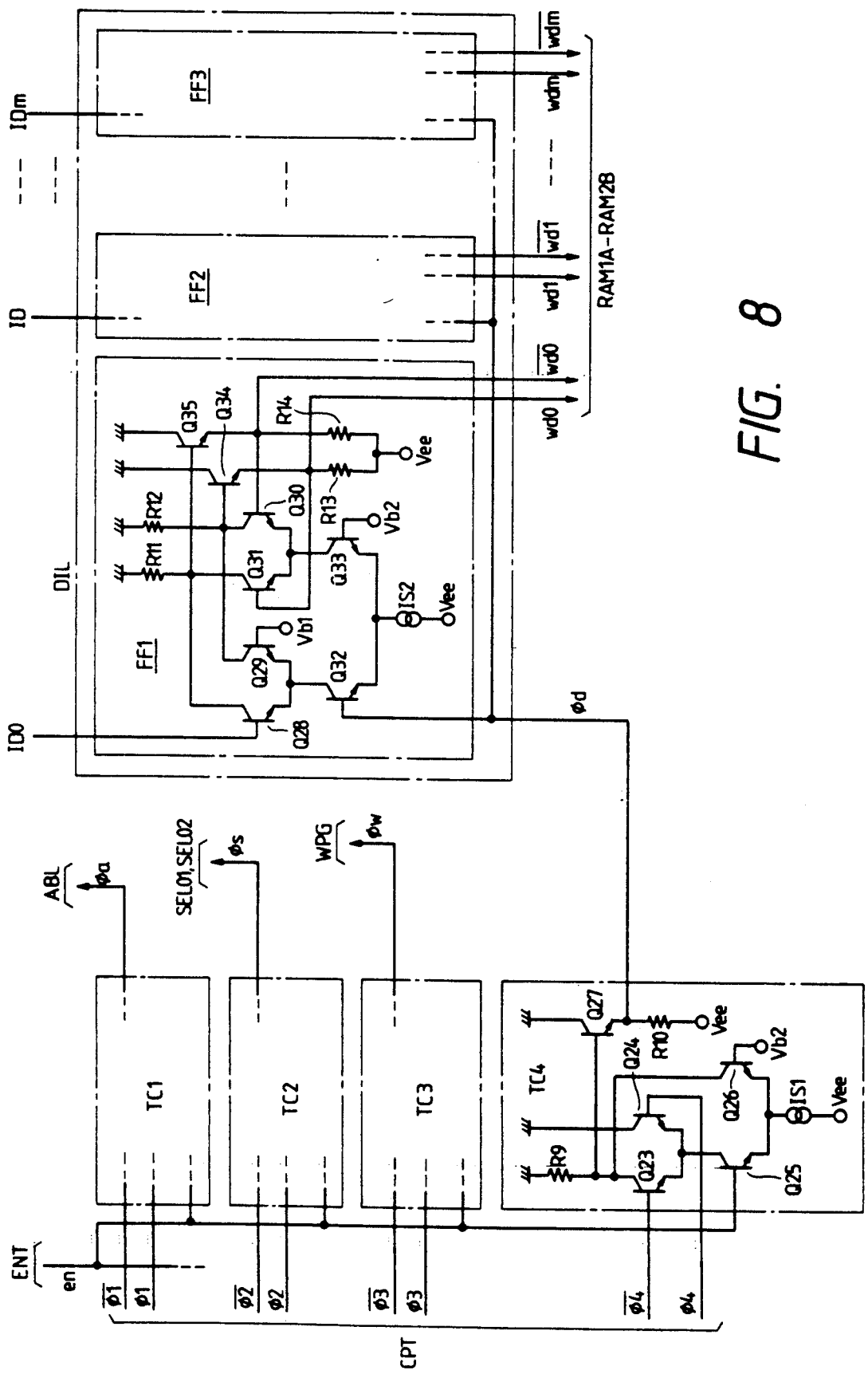
FIG. 8 is a circuit diagram showing an example of a timing generation circuit and a data input latch circuit contained in the semiconductor integrated circuit shown in FIG. 5.

FIG. 8 is a circuit diagram showing an example of the data input latch circuit DIL and the timing control circuits TC1-TC4 of the semiconductor integrated circuit LSI shown in FIG. 5. Incidentally, the afore-mentioned address buffer ABL has the same structure as that of ABL of this embodiment.

In FIG. 8, the data input latch circuit DIL of the semiconductor integrated circuit LSI includes m+1 flip-flop circuits that are disposed in such a manner as to correspond to input data ID0-IDm, respectively. As typified by the flip-flop circuit FF1, each of these flip-flop circuits include three pairs of differential transistors Q28-Q29, Q30-Q31 and Q32-Q33. Among them, the differential transistors Q28, Q29 and Q32 and the differential transistors Q30, Q31 and Q33 have the series gate forms, respectively.

The corresponding input data ID0-IDm is supplied to the base of the transistor Q28 of each flip-flop circuit. A reference potential Vb1 which is a predetermined voltage is supplied in common to the base of the transistor Q29. The collectors of the transistors Q28, Q29 are coupled to the ground potential of the circuit through the resistors R11, R12, respectively. The emitters of the transistors Q28, Q29 that are mutually connected are coupled to the power source voltage Vee of the circuit through the transistor Q32 and the current source IS2. This power source voltage Vee is a predetermined negative voltage, though this is not particularly limitative. Accordingly, the differential transistors Q28, Q29 operate as a current switch circuit using the reference potential Vb1 as its logic threshold level when the transistor Q32 is turned ON.

The collectors of the transistors Q28, Q29 are connected in common to the collectors of the transistors Q30, Q31 and further to the bases of the transistors Q35, Q34, respectively. The collectors of these transistors Q35, Q34 are connected to the ground potential of the circuit and load resistors R14 and R13 are disposed between their emitters and the power source voltage Vee of the circuit, respectively. Accordingly, the transistors Q35, Q34 form the output emitter follower circuits in cooperation with the corresponding load resistors R14, R13, respectively. The emitter voltages of the transistors Q35, Q34 are supplied as the corresponding output signals of the data input latch circuit DIL, that is, the inversion internal write data $\overline{wd0-wdm}$ and the non-inversion internal write data wd0-wdm to RAM1A-RAM2B described already, and also to the bases of the transistors Q31, Q34, respectively.

The commonly connected emitters of the transistors Q30 and Q31 are connected to the collector of the transistor Q33. The emitter of this transistor Q33 is connected to that of the transistor Q32 and further to the power source voltage Vee of the circuit through the current source IS2 described above. The timing signal $\phi$d from the control circuit TC is supplied in common to the base of the transistor Q32 of each flip-flop circuit and the reference potential Vb2 which is at a predetermined voltage is supplied in common to the base of the transistor Q33. Accordingly, the differential transistors Q32 and Q33 operate as another current switch circuit using the reference potential Vb2 as the logic threshold level.

The flip-flop circuits FF1-FF3 of the input data latch circuit DIL operate in the following way in accordance with the timing signal $\phi$d described above. Namely, when the timing signal $\phi$d is at a level higher than the reference potential Vb2, the transistor Q32 is turned ON while the transistor Q33 is cut off. Therefore, the operation current by the current source IS2 is supplied to the differential transistors Q28, Q29, whereby the level judgement operation of the input data ID0-IDm is effected. At this time, if the corresponding input data ID0-IDm is at a level higher than the reference potential Vb1, the transistor Q28 is turned ON while the transistor Q29 is cut off. Therefore, the collector voltage of the transistor Q29 is at the high level such as the ground potential of the circuit and the collector voltage of the transistor Q28 is at a predetermined low level which is determined by the product of the resistance value of the load resistor R11 and the operation current value supplied from the current source IS2. The collector voltages of the transistors Q28 and Q29 are level-shifted by the level corresponding to the base-emitter voltage of the transistors Q35 and Q34 and are then transmitted as the non-inversion internal write data wd0-wdm and the inversion internal write data $\overline{wd0-wdm}$ to RAM1A-RAM2B.

Next, when the timing signal $\phi$d is at the lower level than the reference potential Vb2, the transistor Q32 is cut off while the transistor Q33 is turned ON. Therefore, the differential transistors Q28 and Q29 are inoperative and instead the other differential transistors Q30 and Q31 become operative. As described already, the bases of the transistors Q30 and Q31 are connected in common to the emitters of the transistors Q34 and Q35. Therefore, the collector voltage of the transistor Q31 which is reduced by the base-emitter voltage of the transistor Q34 is transmitted to the base of the transistor Q30 by this transistor Q34 while the collector voltage of the transistor Q30 which is reduced by the base-emitter voltage of the transistor Q35 is transmitted to the base of the transistor 31, on the contrary. In other words, the transistor Q30 operates in such a manner as to set the emitter voltage of the other transistor Q35, that is, the corresponding inversion internal write data $\overline{wd0-wdm}$, to the high or low level when the emitter voltage of the transistor Q34, that is, the corresponding internal write data wd0-wdm, is at the low or high level. Similarly, the transistor Q31 operates in such a manner as to set the emitter voltage of the other transistor Q34, that is, the corresponding inversion internal data write data wd0-wdm, to the high or low level when the emitter voltage of the transistor Q35, that is, the corresponding inversion internal write data $\overline{wd0-wdm}$, is at the low or high level. Accordingly, the differential transistors Q30, Q31 and Q34, Q35 are under the mutually latched state and hold the state in accordance with the input data ID0-IDm immediately before the change of the timing signal $\phi$d to the low level. Needless to say, the flip-flop circuits FF1-FF3 hold this state until the timing signal $\phi$d is set next to the high level.

As described already, the timing control circuits TC1-TC4 are disposed so as to correspond to the address latch circuits ABL contained in RAM-1A-RAM2B, the output select circuits SEL01, SEL02, the write pulse generation circuit WPG and the input latch circuit DIL. The internal enable signal en is supplied as the control signal in common to the timing circuits TC1-TC4 from the enable shaping circuit ENT. Furthermore, the complementary internal clock signals $\phi 1, \overline{\phi 1}$ are supplied to the timing control circuit TC1 from the clock shaping circuit CPT. Similarly, the complementary internal clock signals $\phi 2, \overline{\phi 2}, \phi 3$ and $\phi 4, \overline{\phi 4}$ are supplied from the clock shaping circuit CPT to the timing control circuits TC2, TC3 and TC4, respectively. The output signal of the control circuit TC is supplied as the timing signal $\phi a$ described above to the address latch circuit ABL contained in each of RAM1A-RAM2B. Similarly, the output signals of the timing control circuit TC2, TC3, TC4 are supplied as the timing signals $\phi s, \phi w$ and $\phi d$ to the output select circuits SEL01, SEL02, the write pulse generation circuit WPG and the data input latch circuit IDL.

Since the timing control circuits TC1-TC4 have mutually the same structure, only the timing control circuit TC3 is shown as the representative in FIG. 8. This circuit TC3 consists primarily of two pairs of differential transistors Q23, Q24 and Q25, Q26. The collector of the transistor Q23 is connected to the ground potential of the circuit through a load resistor R9 and further connected in common to the collector of the transistor Q23 and the base of the transistor Q27. The inversion internal clock signal $\overline{\phi 4}$ and the non-inversion internal clock signal $\phi 4$ are supplied to the bases of the transistors Q23 and Q24, respectively. The commonly connected emitters of the transistors Q23, Q24 are coupled to the power source voltage Vee of the circuit through the transistor Q25 and the current source IS1. Accordingly, the differential transistors Q23, Q24 are made selectively operative when the transistor Q25 is turned ON, and are turned ON or cut OFF complementarily in accordance with the complementary internal clock signal $\phi 4$.

On the other hand, the emitter of the transistor Q26 is connected in common to the emitter of the transistor Q25 and further to the power source voltage Vee of the circuit through the current source IS1. The internal enable signal en from the enable shaping circuit ENT is supplied to the base of the transistor Q25 and the reference potential Vb2 is supplied to the base of the transistor Q26. Accordingly, the differential transistors Q25 and Q26 operate as a current switch circuit using the reference potential Vb2 as its logic threshold level with respect to the internal enable signal en.

The collector of the transistor Q27 is connected to the ground potential of the circuit and a load resistor R10 is disposed between its emitter and the power source voltage Vee of the circuit. Accordingly, the transistor Q27 constitutes an output emitter follower circuit in cooperation with the load resistor R10. The emitter voltage of the transistor Q27 is supplied as the corresponding timing signal $\phi a, \phi s, \phi w, \phi d$ to the corresponding circuit.

The timing control circuits TC1-TC4 generate selectively the timing signals $\phi a, \phi s, \phi w$ and $\phi d$ described above in accordance with the internal enable signal en. In other words, when the internal enable signal en is at the low level, the transistor Q26 is turned ON and the transistor Q25 is cut OFF. Accordingly, the differential transistors Q23, Q24 are made inoperative and the collector of the transistor Q26, that is, the collector of the transistor Q23, is set to a predetermined low level which is determined by the product of the resistance value of the load resistor R9 and the value of the operation current supplied from the current source IS1. The collector voltage of the transistor Q23 is further lowered by the base-emitter voltage of the transistor Q27 and is outputted as the output signal of each timing control circuit, that is, the timing signal $\phi a, \phi s, \phi w, \phi d$. In other words, when the internal enable signal en is at the low level, the timing signals $\phi a, \phi s, \phi w$ and $\phi d$ are at the low level irrespective of the corresponding complementary internal clock signals $\phi 1-\phi 4$.

Next, when the internal enable signal en shifts to the high level, the transistor Q26 is cut OFF while the transistor Q25 is turned ON in each timing control circuit TC1-TC4. Accordingly, the differential transistors Q23, Q24 are made operative. At this time if the corresponding complementary internal clock signals $\phi 1-\phi 4$ are set to the logic "0" and the inversion internal block signals $\overline{\phi 1}-\overline{\phi 4}$ are at the higher level than the non-inversion internal clock signals $\phi 1-\phi 4$, the transistor Q23 is turned ON while the transistor Q24 is cut OFF. Therefore, the collector voltage of the transistor Q24 shifts to the high level such as the ground potential of the circuit and the collector voltage of the transistor Q23 is at the predetermined low level which is determined by the product of the resistance value of the load resistor R9 and the value of the operation current supplied from the current source IS1. On the other hand, when the differential transistors Q23, Q24 are operative, the corresponding complementary internal clock signals $\phi 1-\phi 4$ are set to the logic "1" and if the inversion internal clock signals $\overline{\phi 1}-\overline{\phi 4}$ are at the lower level than the non-inversion internal clock signals $\phi 1-\phi 4$, the transistor Q23 is cut OFF while the transistor Q24 is turned ON. Therefore, the collector voltage of the transistor Q23 shifts to the high level such as the ground potential of the circuit. The collector voltage of the transistor Q23 is lowered by the base-emitter voltage of the transistor Q27 and is outputted as the output signal of each AND gate circuit, that is, the timing signal $\phi a, \phi s, \phi w, \phi d$. In other words, when the internal enable signal en is at the high level, the timing signals $\phi a, \phi s, \phi w$ and $\phi d$ are set selectively to the high level in acccordance with the complementary internal clock signals $\phi 1-\phi 4$ corresponding thereto. In other words, the non-inversion enable signals $\phi 1-\phi 4$ are transmitted only in the cycle in which the internal enable signal en is at the high level and become the high level timing signals $\phi a, \phi s, \phi w$ and $\phi d$.

As described above, these timing signals $\phi a, \phi s, \phi w$ and $\phi d$ are supplied to the corresponding address latch circuit ABL, output select circuits SEL01, SEL02, write pulse generation circuit WPG and data input latch circuit DIL, and the corresponding address signals A1-0–Ali, A20–A2i, output select signal $\overline{OS}$, write enable signal $\overline{WE}$ and input data ID0–IDm are inputted to the circuits corresponding to them.

As described above, in this embodiment, the address signals A10–Ali, A20–A2i, the input data ID0–IDm, and the like, are received and held by the corresponding data input latch circuit IDL, the address latch circuit ADL, etc., in accordance with the predetermined timing signals $\phi a, \phi d$, and the like. Therefore, the address signals A10–Ali, A20–A2i and the input data ID0 - IDm are synchronized with the timing signals, that is, the system clock signals CP1-CP4. Accordingly, the skew between the signals is reduced, the number of circuit devices of the address latch circuit and input data latch circuit can be reduced remarkably in comparison with the case where the standard flip-flop circuits are used for the semiconductor integrated circuit and its necessary layout area can be reduced. In this manner the cost of production can be reduced and equivalently, its operation speed can be improved.

Figure 9:
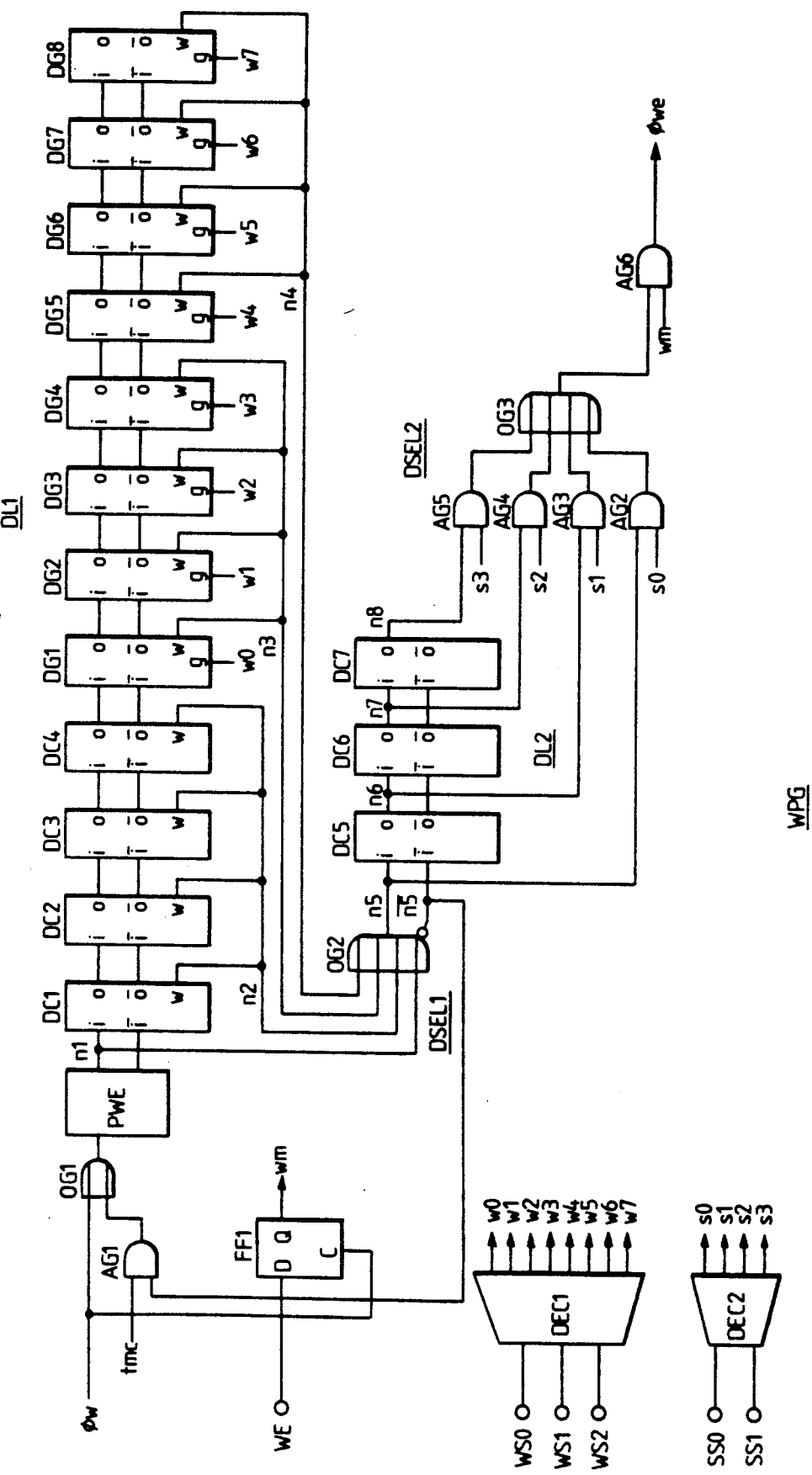
FIG. 9 is a circuit diagram showing an example of a write pulse generation circuit contained in the semiconductor integrated circuit shown in FIG. 5.
Figure 10:
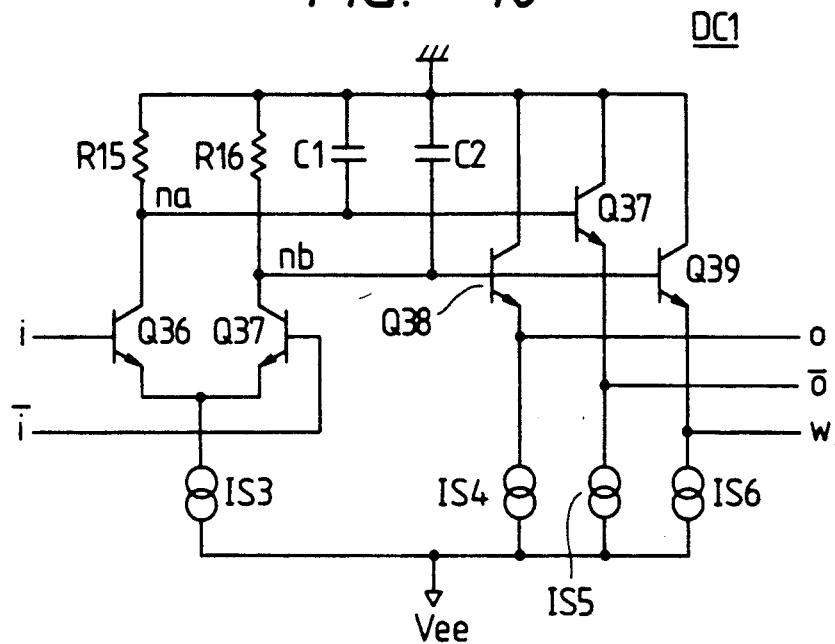
FIG. 10 is a detailed circuit diagram showing an example of a unit delay circuit contained in the write pulse generation circuit shown in FIG. 9.
Figure 11:
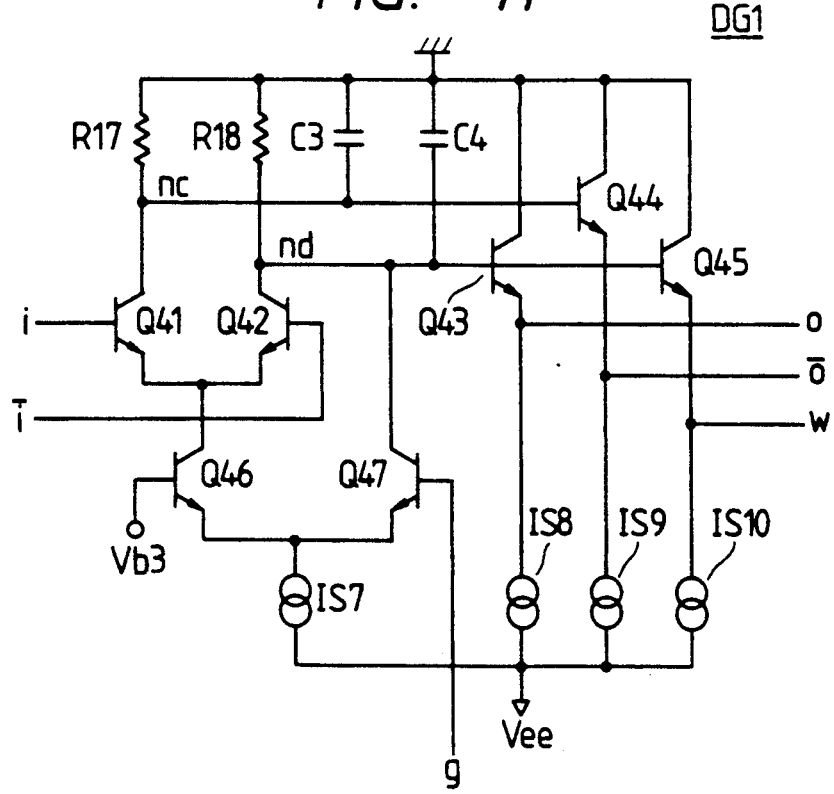
FIG. 11 is a detailed circuit diagram showing an example of a unit delay gate circuit contained in the write pulse generation circuit shown in FIG. 9.

FIG. 9 is a circuit diagram showing an example of the write pulse generation circuit WPG of the semiconductor integrated circuit LSI shown in FIG. 5. FIGS. 10 and 11 are circuit diagrams showing the unit delay circuit DC1 and the delay gate circuit DG1 contained in the write pulse generation circuit WPG shown in FIG. 9. The definite structure and operation of the write pulse generation circuit WPG contained in the semiconductor integrated circuit LSI of this embodiment will be described with reference to these drawings.

In FIG. 9, the timing signal $\phi w$ supplied from the timing control circuit TC3 described above is supplied to one of the input terminals of an OR gate circuit OG1 and to the clock input terminal C of the flip-flop circuit FF4. The output signal of an AND gate circuit AG1 is supplied to the other input terminal of the OR gate circuit OG1. The internal control signal tmc from the control circuit not shown is supplied to one of the input terminals of the AND gate circuit AG1 and an inversion output signal n5 of a later-appearing OR gate circuit OG2 is supplied to the other input terminal. The output signal of the OR gate circuit OG1 is supplied to the input terminal of a pulse width expansion circuit PWE. Here, the timing signal $\phi w$ supplied from the timing control circuit TC3 is at the ECL level, though not particularly limitative, and is set temporarily to the high level in a predetermined cycle for a predetermined period in accordance with the aforementioned internal complementary clock signals $\phi 4$. The internal control signal tmc is set to the low level when the semiconductor integrated circuit LSI is in the normal operation mode, though this is not particularly limitative, and is set selectively to the high level when the memory equipped with the logic function is in a predetermined test mode.

As described above, when the semiconductor integrated circuit LSI is in the normal operation mode the timing signal $\phi w$ supplied from the aforementioned timing control circuit TC4 is transmitted to the pulse width expansion circuit PWE through the OR gate circuit OG1. When the memory equipped with the logic function is in the predetermined test mode and when the internal control signal tmc is at the high level, the inversion output signal n5 of the OR gate circuit OG2 is transmitted to the pulse width expansion circuit PWE through the AND gate circuit AG1 and the OR gate circuit OG1, thereby forming an oscillation loop including the pulse width expansion circuit PWE and the delay circuit DL1.

The write enable signal WE supplied through the external terminal is supplied to the data input terminal D of the flip-flop circuit FF1. The timing signal $\phi w$ is supplied to the clock input terminal C of this flip-flop circuit FF1. Accordingly, the flip-flop circuit FF4 is triggered by the timing signal $\phi w$ and accepts the write enable signal WE described above. Though not particularly limitative, the write enable signal WE is set selectively to the high level when RAM1A, RAM1B or RAM2A, RAM2B in the semiconductor integrated circuit LSI is in the write mode. The output signal of the flip-flop circuit FF4 is supplied to each circuit of the write pulse generation circuit WPG as the write mode signal, that is, the internal control signal wm.

On the other hand, the 3-bit pulse width select signals WS0-WS2 supplied as the select control signal through the external terminal are inputted to the decoder DEC1. This decoder DEC1 decodes the pulse width select signals WS0-WS2 described above and sets alternatively the corresponding select signals w0-w7. These select signals are supplied to the control input terminals g of the corresponding delay gate circuits DG1-DG8 of a later-appearing delay circuit DL1.

Similarly, 2-bit setup time select signals SS0 and SS1 supplied as the select control signals through the external terminal are supplied to a decoder DEC2. This decoder DEC2 decodes the setup time select signals SS0, SS1 and sets alternatively the corresponding select signals s0-s3 to the high level. These select signals are supplied to the corresponding AND gate circuits AG2-AG5 of a later-appearing delay select circuit DSEL2, respectively.

Though not particularly limitative, the pulse width expansion circuit PWE delays the clock signal $\phi w$ or the like supplied through the OR gate OG1 by a predetermined time and expands its pulse width by about thrice. The non-inversion output signal n1 and inversion output signal $\overline{n1}$ of this pulse width expansion circuit PWE are supplied to the non-inversion input terminal i and inversion input terminal $\overline{i}$ of a unit delay circuit DC1 constituting the delay circuit DL1 and to the first input terminal of the OR gate circuit OG2.

Though not particularly limitative, the delay circuit DL1 consists of four unit delay circuits DC1-DC4 and eight delay gate circuits DG1 - DG8 whose non-inversion output terminals o and inversion output terminals $\overline{o}$ are connected sequentially to their non-inversion input terminals i and inversion input terminals $\overline{i}$.

As typified by the unit delay circuit DC shown in FIG. 10, each of these unit delay circuits DC1-DC4 consists fundamantally of a pair of differential transistors Q36 and Q37. The collector of the transistor Q36 is used as a node na and is connected to the ground potential of the circuit through a load resistor R15 correspondingly thereto. Similarly, the collector of the transistor Q37 is used as a node nb and is connected to the ground potential of the circuit through a corresponding load resistor R16. A constant current source IS3 is disposed between the commonly connected emitters of these differential transistors Q36, Q37 and the power source voltage Vee of the circuit. Here, the power source voltage Vee of the circuit is a predetermined negative power source voltage, though this is not particularly limitative. The bases of the transistors Q36 and Q37 are the non-inversion input terminal i and inversion input terminal $\overline{i}$ of this unit delay circuit DC1, respectively.

The collector of the transistor Q36 is connected in common to the base of the transistor Q39. A capacitor C1 is disposed between the collector of the transistor Q36 and the ground potential of the circuit. Similarly, the collector of the transistor Q37 is connected in common to the bases of the transistors Q38 and Q40. A capacitor C2 is disposed between the collector of the transistor Q37 and the ground potential of the circuit. Though not particularly limitative, these capacitors C1 and C2 are formed by the emitter capacitance of bipolar transistors and are designed in such a manner as to possess a predetermined electrostatic capacitance corresponding to the delay time of the unit delay circuit DC1.

The collector of the transistor Q38 is connected to the ground potential of the circuit and a constant current source IS4 is disposed between its emitter and the power source voltage Vee. Accordingly, the transistor Q38 constitutes an output emitter follower circuit in cooperation with the constant current source IS4 corresponding thereto. The emitter of this transistor Q38 is connected to the non-inversion output terminal o of this unit delay circuit DC1. Similarly, the collectors of the transistors Q38 and Q40 are connected to the ground potential of the circuit and constant current sources IS5 and IS6 are disposed between their emitters and the power source voltage Vee of the circuit. Accordingly, the transistors Q39, Q40 constitute output emitter follower circuits in cooperation with the constant current sources IS5, IS6 corresponding to them, respectively. The emitter of the transistor Q39 is connected to the inversion output terminal $\bar{o}$ of this unit delay circuit DC1. The emitter of the transistor Q40 is connected to a wired-OR output terminal w of this unit delay circuit DC1. The wired-OR output terminal w of each unit delay circuit is directly connected to the wired-OR output terminal w of the other unit delay circuit, thereby forming a wired logical sum circuit.

When the non-inversion input terminal i is lower than the inversion input signal $\bar{i}$, the transistor Q37 is turned ON while the transistor Q36 is cut OFF. Therefore, the potential at the collector of the transistor Q36, that is, at the node na, is at the high level such as the ground potential of the circuit, while the potential at the collector of the transistor Q37, that is, at the node nb, is at the predetermined low level which is determined by the current value of the constant current source IS3 and the resistance value of the load resistor R2. The high level of the node na is shifted by the base-emitter voltage of the transistor Q39 and is then outputted as the inversion output signal $\bar{o}$ of the unit delay circuit DC1. The low level of the node nb is shifted by the base-emitter voltage of each of the transistors Q38 and Q40 and is then turned to the non-inversion output signal o and wired-OR output signal w of the unit delay circuit DC1, respectively.

Next, when the non-inversion input terminal i is set to the higher level than the inversion input terminal $\bar{i}$, transistor Q37 is cut OFF and instead, the transistor Q36 is about to be turned ON, and along therewith the potential of the node na changes from the high level to the predetermined low level determined by the current value of the constant current source IS3 and the resistance value of the load resistor R1 and the potential of the node nb is about to change to the high level such as the ground potential of the circuit from the low level. As described above, however, the capacitors C1 and C2 are disposed between the node na and the ground potential of the circuit and between nb and the ground potential. Accordingly, the levels of the nodes na and nb change gradually in accordance with the time constants that are determined by the electrostatic capacitance of the capacitor C1 and the current value of the constant current source IS3 and by the electrostatic capacitance of the capacitor C2 and the resistance value of the load resistor R2, respectively, so that the status of each transistor Q36, Q37 shifts in accordance with this change. As a result, the non-inversion output signal o, inversion output signal $\bar{o}$ and wired-OR output signal w of the unit delay circuit DC1 change belatedly by the predetermined delay time with respect to the non-inversion input signal i and the inversion input signal $\bar{i}$.

On the other hand, as typified by the delay gate circuit DG1 shown in FIG. 11, the delay gate circuits DG1-DG8 have fundamentally the same structure as the unit delay circuit DC1-DC4 described above and each functions as a unit delay circuit constituting the delay circuit DL1. In FIG. 11, transistors Q41-Q45, resistors 17, R18, capacitors C3, C4 and constant current sources IS7, IS10 correspond as such to the transistors Q36-Q40, resistors R15, R16, capacitors C1, C2 and constant current sources IS3, IR6 that are shown in FIG. 10. The collectors of the transistors Q41 and Q42 are nodes nc and nd, respectively, and the bases of these transistors are non-inversion input terminal i and inversion input terminal $\bar{i}$ of the delay gate circuit DG1, respectively. Hereinafter, the description will be given on the difference of the unit delay circuits DC1-DC4 from the delay gate circuits DG1-DG8.

In FIG. 11, the commonly connected emitters of the differential transistors Q41, Q42 are connected to the collector of the transistor Q46. The emitter of this transistor Q46 is connected in common to the emitter of the transistor Q47 in the differential form and further to the power source voltage Vee of the circuit through the constant current source IS7. The collector of the transistor Q47 is connected to the node nd and its base is used as the control input terminal g of this delay gate circuit DG1. A predetermined reference potential Vb3 is supplied from a constant voltage generation circuit, not shown, of the semiconductor integrated circuit LSI to the base of the transistor Q46. Here, the reference potential Vb3 is at an intermediate level between the low and high levels of the select signals w0-w7 supplied to the control input terminal g. Therefore, the differential transistors Q46, Q47 operate as a current switch circuit using the reference potential Vb3 as its logic threshold level with respect to the select signals w0-w7 supplied to the control input terminal g.

When the corresponding select signal w0-w7 is at the lower level than the reference potential Vb3, the transistor Q47 is cut OFF while the transistor Q46 is turned ON. In consequence, the differential transistors Q41, Q42 become operative and the non-inversion output signal o and inversion output signal $\bar{o}$ of the delay gate circuit DG1 and the wired-OR output signal w are set selectively to the high and low levels in accordance with the non-inversion input signal i and inversion input signal $\bar{i}$ in the same way as the unit delay circuit DC1 shown in FIG. 10.

On the other hand, when the corresponding select signal w0-w7 is at the higher level than the reference potential Vb3, the transistor Q46 is cut OFF and instead, the transistor Q47 is turned ON. Therefore, the differential transistors Q41, Q42 are inoperative and the node nd is set compulsively to a predetermined low level. At this time the node nc is at the high level such as the ground potential of the circuit because the differential transistors Q41, Q42 are inoperative. Accordingly, the non-inversion output signal o and the wired-OR output signal w of the delay gate circuit DG1 are fixed to the low level irrespective of the corresponding select signal w0-w7 and the inversion output signal $\bar{o}$ is fixed to the high level.

In other words, when the select signal w0-w7 supplied to the control input terminal g is at the low level, the delay gate circuit DG1–DG8 functions as a unit delay circuit which delays the complementary input signal supplied to the non-inversion input terminal i and the inversion input terminal ī by a predetermined delay time in the same way as the unit delay circuit DC1–DC4. When the corresponding select signal w0–w7 is at the low level, the output signal of the delay gate circuit Dg1–DG8 is fixed to the logic "0" state where the non-inversion output signal o and the wired-OR output signal w are at the high level and the inversion output signal ō is at the low level, irrespective of the levels of the non-inversion input signal i and the inversion input signal ī.

In FIG. 9, the wired-OR output terminal w of the unit delay circuit DC1–DC4 is connected in common and is used as the node n2. Therefore, the node n2 is selectively set to the high level when the wired-OR output signal w of any of the unit delay circuits DC1–DC4 is at the high level. The node n2 is connected further to the second input terminal of the OR gate OG2. On the other hand, the wired-OR output terminals w of the delay gate circuits DG1–DG4 are connected mutually and form the node n3. Therefore, the node n3 is set selectively to the high level when the wired-OR output signal w of any of the delay gate circuits DG1–DG4 is at the high level. The node n3 is connected further to the third input terminal of the OR gate circuit OG2. Similarly, the wired-OR output terminals w of the delay gate circuits DG5–DG8 are connected mutually and form the node n4. Therefore, the node n4 is set selectively to the high level when the wired-OR output signal w of any of the delay gate circuits DG5–DG8 is at the high level. The node n4 is connected further to the fourth input terminal of the OR gate circuit OG2.

Accordingly, the non-inversion output signal n5 of the OR gate circuit OG2 is set selectively to the high level when the output signal of any of the pulse width expansion circuit PWE, the unit delay circuits DC1–DC4 and the delay gate circuits DG1–DG8 is at the high level. The inversion output signal n5 of the OR gate circuit OG2 is set to the high level complementarily with the non-inversion output signal n5 described above. As described above, the wired-OR output signals w of the delay gate circuits DG1 - DG8 are fixed selectively to the low level when the corresponding select signal w0–w7 is at the high level. Therefore, the wired-OR output signals w of all the delay gate circuits connected to the post-stage of the delay gate circuit whose wired-OR output signal w is fixed are fixed likewise to the low level. In other words, the OR gate circuit OG2 functions as the OR gate for the output signals of the pulse width expansion circuit PWE, unit delay circuits DC1–DC4 and delay gate circuits DG1–DG8, and constitutes the delay select circuit DSEL1 in cooperation with the delay gate circuits DG1–DG8 which are made selectively effective in accordance with the select signals w0–w7. Needless to say, the pulse width of the output signal n5 of the OR gate circuit OG2 becomes minimal when the select signal w0 is at the high level and is the value which is the sum of the pulse width of the output signal n1 of the pulse width expansion circuit PWE and the total delay time of the unit delay circuits DC1–DC4. The pulse width of the output signal n5 of the OR gate circuit OG2 becomes maximal when all the select signals w0–w7 are at the low level and is the value which is the sum of the pulse width of the output signal n1 of the pulse width expansion circuit PWE and the total delay time of the unit delay circuits DC1–DC4 and delay gate circuits DG1–DG4. Accordingly, the delay circuit DL1 functions as a delay circuit which determines the pulse width of the output signal n5 of the OR gate circuit OG2 and eventually, the pulse width of the write pulse, that is, the timing signal φwe.

The non-inversion output signal n5 and inversion output signal n5 of the OR gate circuit OG2 are supplied to the non-inversion input terminal i and inversion input terminal ī of the delay circuit DL2, respectively. As described already, the inversion output signal n5 is supplied to one of the input terminals of the AND gate circuit AG1 and the non-inversion output signal n5 is supplied to one of the input terminals of the AND gate circuit AG2 of the delay select circuit DSEL2.

The delay circuit DL2 consists of three unit delay circuits DC5–DC7 connected in the series form by sequentially connecting their non-inversion output terminals o and inversion output terminals ō to the non-inversion input terminals i and inversion input terminals ī, though this circuit arrangement is not particularly limitative. These unit delay circuits DC5–DC7 have the same circuit construction as the unit delay circuits DC1–DC4, though not particularly limitative, and their non-inversion output signals o are used as the node n6–n8, respectively. The node n6 is supplied to one of the input terminals of the AND gate circuit AG3 of the output select circuit SEL2. Similarly, the nodes n7 and n8 are supplied to one of the input terminals of the AND gate circuits AG4, AG5 of the delay select circuit DSEL2, respectively.

The delay circuit DL2 consisting of the unit delay circuits DC5–DC7 delays sequentially as a whole the output signal n5 of the OR gate circuit OG2 having a predetermined pulse width without changing its pulse width.

The corresponding select signal s0–s3 is supplied from the decoder DEC2 to the other input terminal of each AND gate circuit AG2–AG5, though this is not particularly limitative. The output signal of the AND gate circuit AG2 is supplied to the first input terminal of the OR gate circuit OG3. Similarly, the output terminal of each AND gate circuit AG3–AG5 is supplied to the second to fourth input terminal of the OR gate circuit OG3, respectively. Thus, when the output signal of any of the AND gate circuits AG2–AG5 is at the high level, the output signal of the OR gate circuit OG3 is selectively set to the high level. In other words, the delay select circuit DSEL2 consisting of the AND gate circuits AG2–AG5 and the OR gate circuit OG3 has the function of selectively transmitting the corresponding output signal n5–n8 of the delay select circuit DSEL1 or delay circuit DL2 when the select signal s0–s3 is set selectively to the high level.

The output signal of the OR gate circuit OG3 is supplied to one of the input terminals of the AND gate circuit AG6. The output signal of the flip-flop circuit FF1, that is, the internal control signal wm, is supplied to the other input terminal of this AND gate circuit AG6. Accordingly, the output signal of the AND gate circuit AG6, that is, the write pulse or timing signal φwe, is selectively set to the high level when the output signal of the delay select circuit DSEL2 and the internal control signal wm are at the high level. In other words, in the write pulse generation circuit WPG of the semiconductor integrated circuit LSI of this embodiment, the output signal of the OR gate circuit OG3 generated on the basis of the clock signal φw, that is, the output signal of the delay select circuit DSEL2, is always generated irrespective of the operation modes, and when RAM1A, RAM1B or RAM2A, 2B are in the write mode in their cycle and when the internal control signal wm is at the high level, the timing signal φwe is selectively supplied to the write amplifier WA through the afore-mentioned gate circuit.

Figure 12:
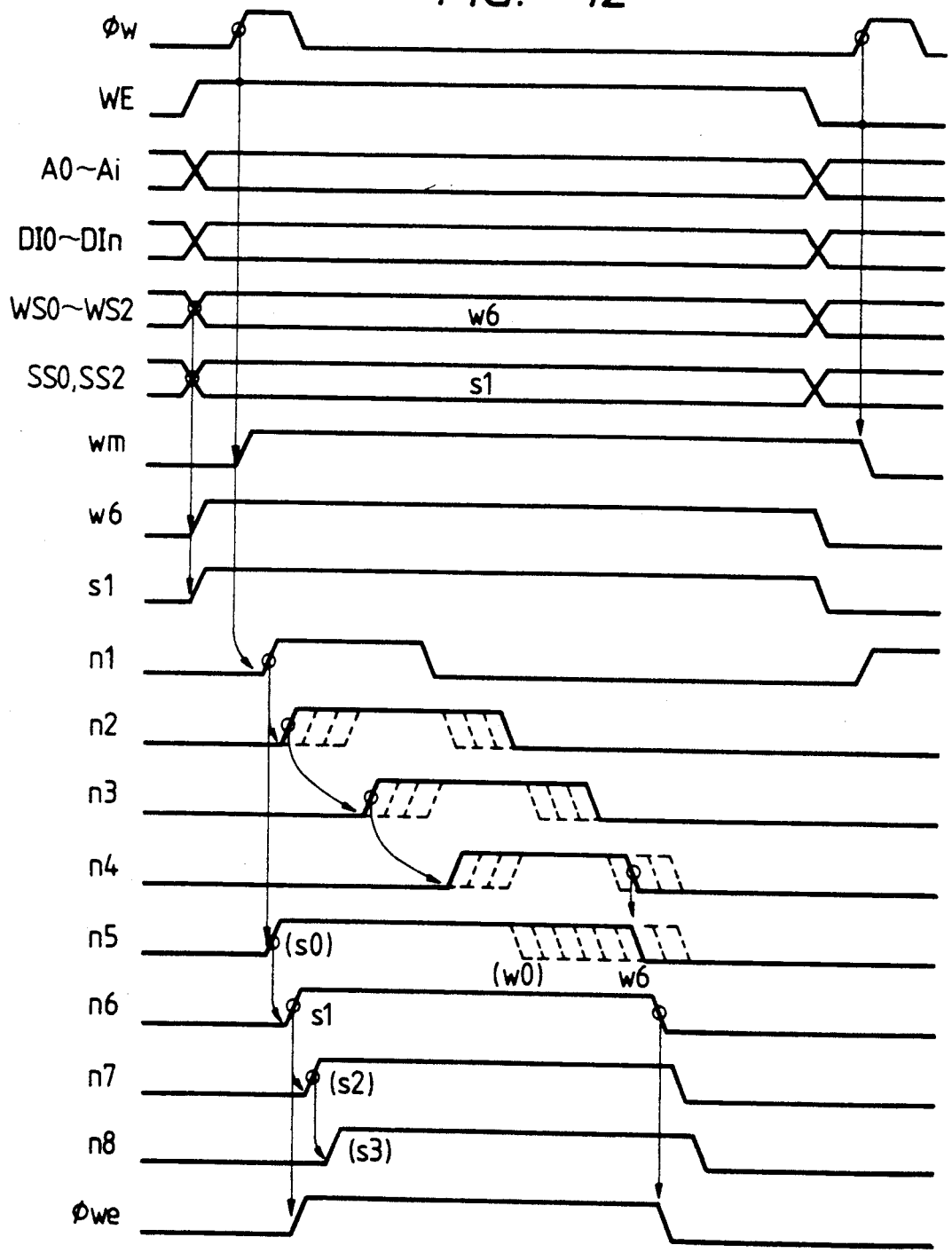
FIG. 12 is a timing chart showing an example of the write pulse generation circuit shown in FIG. 9.

FIG. 12 shows an example of the timing chart of the write pulse generation circuit WPG shown in FIG. 9. In this diagram the pulse width select signals WS0-WS2 are shown combined in such a manner as to set the select signal w6 to the high level and the set-up time select signals SS0, SS1 are shown combined in such a manner as to set the select signal s1 to the high level. The operation of the write pulse generation circuit WPG of this embodiment will be described with reference to FIG. 12.

In FIG. 12, the timing signal φw is a periodical pulse having a relatively small duty in accordance with the aforementioned complementary internal clock signal φ3, though this is not particularly limitative. The write enable signal WE shifts from the low level to the high level before the shift of the timing signal φw to the high level and at the same time, the afore-mentioned predetermined complementary write data wd0-wdm are supplied. The pulse width select signals WS0-WS2 are supplied in the combination which sets the select signal w6 to the high level and the set-up time select signals SS0, SS1 are supplied in the combination which sets the select signal s1 to the high level.

In the write pulse generation circuit WPG, the output signal of the decoder DEC1 or the select signal w6 is set selectively to the high level in accordance with the combination of the pulse width select signals WS0-WS2 and the output signal of the decoder DEC2 or the select signal s1 is set selectively to the high level in accordance with the combination of the set-up time select signals SS0, SS1. Since the write enable signal WE is at the high level at the rise edge of the timing signal φw, the flip-flop FF4 is set and the write mode signal, that is, the internal control signal wm, is set to the high level.

On the other hand, the timing signal φw is supplied to the pulse width expansion circuit PWE through the OR gate circuit OG1 so that there is generated the output signal n1 of the pulse width generation circuit PWE having a pulse width which is about thrice the clock signal CK. This output signal n1 is supplied to the OR gate circuit OG2, raises its output signal n5 to the high level and is supplied to the delay circuit DL1 consisting of the unit delay circuits DC1-DC4 and the delay gate circuits DG1-DG8.

In this embodiment the select signal w6 is alternatively set to the high level as described above. Therefore, the output signal n1 of the pulse width expansion circuit PWE is transmitted to the output terminal of the delay gate circuit DG6 while keeping its pulse width and the output signals of the post-stage delay circuits DG7 and DG8 of the delay gate circuit DG7 are fixed to the low level. Therefore, the nodes n2 and n3 are set to the high level only for the period which is the sum of the pulse width of the output signal n1 of the pulse width expansion circuit PWE and the total delay time of the corresponding unit delay circuits DC1-DC4 and delay gate circuits DG1-DG4. The node n4 is set to the high level only for the period which is the sum of the pulse width of the output signal n1 of the pulse width expansion circuit PWE and the total delay time of the delay gate circuits DG5 and DG6 which are made effective.

As described above, the output signal n5 of the OR gate circuit OG2 is set to the high level when the output signal n1 of the pulse width generation circuit PWE changes to the high level and is returned to the low level when the node n4 changes to the low level. Accordingly, the pulse width of the output signal n5 of the OR gate circuit OG2 assumes the value which is the sum of the pulse width of the output signal n1 of the pulse width generation circuit PWE and the total delay time of the unit delay circuits DC1-DC4 and delay gate circuits DG1-DG6 constituting the delay circuit DL1.

The output signal n5 of the OR gate circuit OG2 is delayed by the unit delay circuits DC5-DC7 constituting the delay circuit DL2 while keeping its pulse width, thereby generating the output signals n6-n8. These output signals n5 and n6-n8 are supplied to the corresponding AND gate circuits AG2-AG5 of the delay select circuit DSEL2, respectively, as described already.

In this embodiment the select signal s1 is set alternatively to the high level. Therefore, the AND gate circuit AG3 is brought alternatively into the transmission state and only the output signal n6 of the unit delay circuit DC5 of the delay circuit DL2 is transmitted as the output signal of the delay select circuit DSEL2. The output signal of the delay select circuit DSEL2 is used as the write pulse or the timing signal φwe as RAM1A, RAM1B or RAM2A, RAM2B are in the write mode and the internal control signal wm is at the high level, and is supplied selectively to the write amplifiers WA contained in RAM1A, RAM1B or RAM2A, RAM2B through the gate circuit not shown, as described above. In this embodiment the write pulse or the timing signal φwe has a predetermined pulse width which is the sum of the pulse width of the output signal n1 of the pulse width expansion circuit PWE and the total delay time of the unit delay circuits DC1-DC4 and delay gate circuits DG1-DG6 constituting the delay circuit DL1, and has a predetermined set-up time which is determined by the total delay time of the pulse width expansion circuit PWE and the unit delay circuit DC5 of the delay circuit DL2.

As described above, in the semiconductor integrated circuit LSI of this embodiment, the write pulse generation circuit WPG has the function of generating autonomously the write pulse φwe having the predetermined pulse width and set-up time on the basis of the timing signal φw and the write enable signal WE. The write pulse generation circuit WPG includes the delay circuit DL1 for determining the pulse width of the write pulse and the delay circuit DL2 for determining the set-up time. These delay circuits DL1, DL2 each consists of a plurality of unit delay circuits DC1-DC7 and delay gate circuit DG1-DG8 that are made effective selectively in accordance with the pulse width select signals WS0 - WS2 or the set-up time select signals SS0, SS1 supplied through the external terminals, and their substantial delay time is controlled by the pulse width select signals WS0-WS2 and the set-up time select signals SS0, SS1. Therefore, the semiconductor integrated circuit LSI of this embodiment can optimize the timing condition of the write pulse even at the stage of the semi-finished product or after completion of the product without needing the mask change. Accordingly, the semiconductor integrated circuit LSI of this embodiment can shorten its development period and can improve the production yield.

Figure 14:
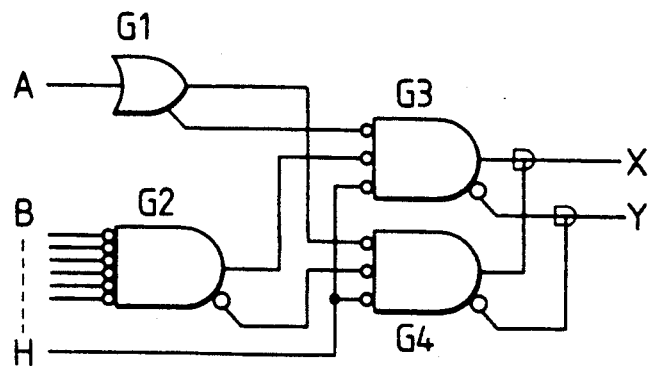
FIG. 14 is an equivalent circuit diagram of the logic circuit shown in FIG. 11.
Figure 13:
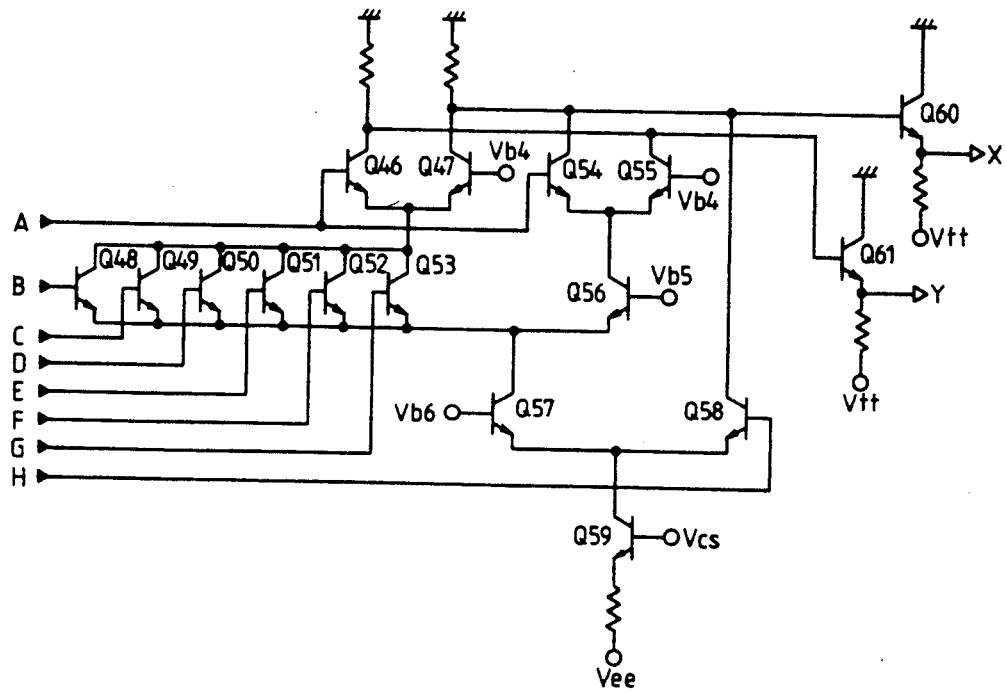
FIG. 13 is a detailed circuit diagram showing an example of a logic circuit contained in the embodiments shown in FIGS. 1, 2 and 5.
Figure 15:
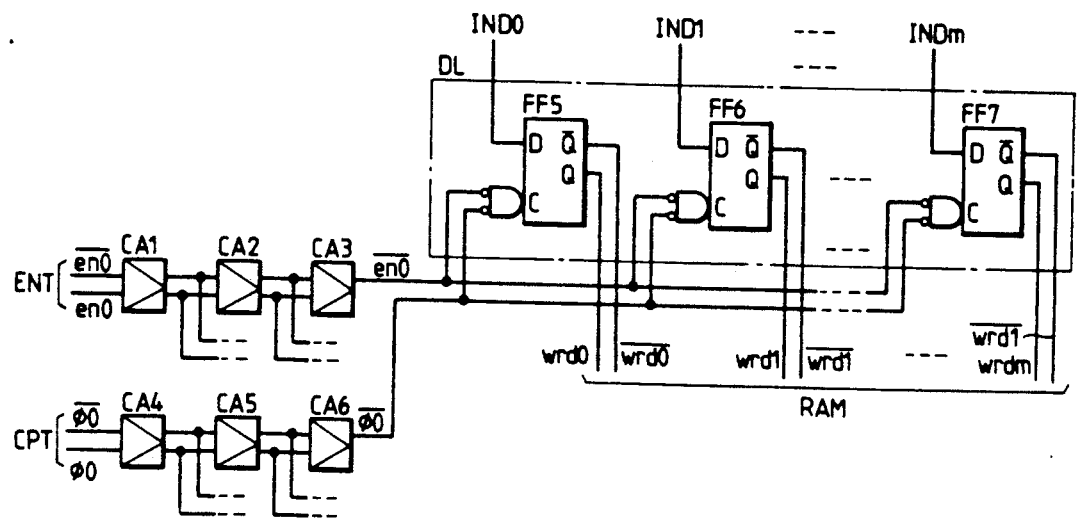
FIG. 15 is a circuit diagram showing an example of a data input latch circuit contained in a conventional semiconductor integrated circuit.

FIG. 13 is a circuit diagram showing an embodiment of the logic circuit that constitutes the logic circuits shown in FIGS. 1, 2, 3, 4 and 5. FIG. 14 is its equivalent logic circuit diagram. In this embodiment, series gates each consisting of an ECL gate circuit as its basis are employed in order to attain a high integration density and a high speed operation of the logic portion. In other words, series circuits of transistors forming the logic portion such as the differential transistors Q46, Q47 and Q54, A55 corresponding to a reference voltage Vb4, the differential transistors such as Q47-Q53 and Q56 corresponding to a reference voltage Vb5 and the differential transistors Q57, Q58 corresponding to a reference voltage Vb6 are connected in multiple stages by use of one reference voltage Vb4 such as the reference voltage Vb4-Vb6 and three reference voltages whose levels are shifted by a forward voltage $V_{BE}$ ($V_F$) of a transistor in a diode form or a diode, so as to employ the wired logic of the output portion. According to this circuit structure, a composite logic gate circuit consisting of the logic gate circuits G1-G4 can be constituted by a smaller number of devices such as the series gate circuits described above and the operation current for effecting the logic operation is only the constant current that is generated by the transistor Q59. Therefore, lower power consumption can also be attained. In comparison with the case where OR gate circuits or NOR gate circuits having only one reference voltage Vbb4 are combined with one another, the signal transmission path between the gates can be shortened and hence, a higher speed operation can be accomplished.

The action and effects brought forth by the foregoing embodiments are as follows.

(1) The logic circuit for exchanging the signals with RAM having a memory capacity of a plurality of bits with the RAMS being the center is divided in accordance with the kinds of signals and the divided logic circuits are disposed in such a manner as to minimize the signal transmission path. Therefore, the signal transmission path becomes the shortest and the signal propagation time can be reduced so that a higher speed access to RAMS can be made.

(2) Since the logic circuits for generating the signals for making the access to the RAMs are formed in the same semiconductor integrated circuit, input/output buffers for RAMS become unnecessary and since the signal propagation delay time that is otherwise generated there does not occur substantially. Accordingly, a higher speed operation can be accomplished with the effect of the item (1) described above.

(3) The logic circuit for exchanging the signals with RAMS having a memory capacity of a plurality of bits with the RAMS being the center is divided in accordance with the kind of signals and the divided logic circuits are disposed in such a manner as to minimize the signal transmission paths. This change of layout can attain easily a higher speed operation of RAMs.

(4) Since the series gates are used as the logic portion, a higher speed operation and a higher integration density can be accomplished.

(5) A plurality of flip-flop groups consisting of fundamental flip-flop circuits whose state are shifted simultaneously in accordance with the common timing signals and which do not contain any logic gate circuits for clock input are disposed on the semiconductor integrated circuit having mounted thereon RAMs and the like, and a timing control circuit for supplying the common timing signal is disposed for each flip-flop group. In this manner, the number of circuit devices such as input latch circuits disposed as the pre-stage circuits or inside RAMs can be reduced and their layout occupying area can be reduced.

(6) Due to the effect described in the item (5) described above, the skew between the timing signals supplied to the input latch circuits can be reduced.

(7) The effects of the items (5) and (6) make it possible to reduce the cost of production of a semiconductor integrated circuit with built-in RAMs and the like and to improve its operation speed.

(8) The delay circuits contained in the write pulse generation circuit or the like of the semiconductor integrated circuit with the built-in RAMs and the like are composed of a plurality of unit delay circuits and there are disposed the delay select circuit for selectively transmitting the output signals of these unit delay circuits in accordance with the select signal and the decoder for decoding a predetermined select control signal and generating alternatively the select signal described above. Accordingly, the delay time of the delay circuit can be controlled.

(9) The effect of the item (8) provides another effect in that the pulse width and set-up time of the write pulse of the semiconductor integrated circuit with the built-in RAMs and the like can be adjusted at the stage of the semi-product or after completion of the product by supplying the select control signal described above from pads or external terminals without requiring the change of a mask, or the like.

(10) Due to the effects of the items (8) and (9), the development period of the semiconductor integrated circuit with the built-in RAMs can be shortened and its production cost can be reduced.

(11) The effects of the items (8) and (9) provide another effect in that the production yeild of semiconductor integrated circuits with built-in RAMs and the like can be improved in mass-producing them.

(12) Due to the synergistic effect of the effects of the items (2), (4), (7) and (10), it is possible to accomplish a further higher speed operation, higher integration density and lower cost of production of a semiconductor integrated circuit with built-in RAMs and the like.

Although the present invention has thus been described with reference to some preferred embodiments thereof, the invention is not particularly limited thereto but can of course be changed or modified in various manners without departing from the scope and spirit thereof. For example, in the embodiments shown in FIGS. 1, 2, 3 and 4, the disposition of RAMs (RAM-1A-2B and RAM1-RAM5) and the logic circuits to be disposed with the RAMs being the center is determined in accordance with the mode of access to RAMs and various dispositions can be employed on the condition that the signal propagation distance is minimized.

In the embodiment shown in FIG. 8, the data input latch circuit DBL may output only the non-inversion signal or the inversion signal and the timing signals $\phi a$, $\phi s$, $\phi w$ and $\phi d$ may be complementary to one another. The timing control circuits TC1-TC4 may be logic gate circuits having at least three inputs and the internal clock signals $\phi 1$-$\phi 4$ need not be complementary signals in particular. Each circuit may use the ground potential of the circuit as the positive power source voltage and the power source voltage Vee of the circuit, as the ground potential, and PNP bipolar transistors may be used by replacing the polarity of the power source voltage. Each flip-flop circuit group may be divided in a suitable number in accordance with the fan-out of the timing control circuit TC1-TC4 and an AND gate circuit for timing control may be combined with each divided flip-flop circuit group. The clock signals CP1-CP4 and the internal clock signals $\phi 1-\phi 4$ need not be of 4-phase, in particular and an arbitrary combination of the clock signal and the timing signal may be employed. It is also possible to use CMOS circuits or the like for the flip-flop circuit groups and the timing control circuits TC1-TC4.

For example, in the embodiments shown in FIGS. 5 and 9, the pulse width select signals WS0-WS2 and the set-up time select signals SS0, SS1 may be supplied through the internal pads at the stage of a probe test, and their bit number may be arbitrary. These pulse width select signals and set-up time select signals may be supplied directly as the select signals without being decoded by the decoder. In such a case, the delay gate circuits DG1-DG8 of the delay circuit DL1 may be replaced by the unit delay circuits. In this case, delay circuits and OR gate circuits for transmitting the output signals of the unit delay circuits in accordance with the select signals w0-w7 are required separately. In the embodiment shown in FIG. 9, the timing signal $\phi$we is generated by generating the signal having the predetermined pulse width and set-up time irrespective of the write enable signal WE and then calculating its logical product with the internal control signal wm, but it is possible to first calculate the logical product of the clock signal CK and the write enable signal WE at the pre-stage of the delay circuit DL1, and then to adjust its pulse width and set-up time. The write pulse generation circuit may be of such a type which uses automatically the pulse width and set-up time of the write pulse as the center value of the adjustable range when the pulse width select signals WS0-WS2 and the set-up time select signals SS0, SS1 are not supplied thereto.

In FIGS. 6, 7, 10, 11 and 13, the definite structures of RAMs, delay circuits, delay gate circuits and logic circuits may use CMOS circuits or their combinations besides the ECL structure described already.

The present invention can be utilized widely for various kinds of semiconductor integrated circuits including RAMs and logic circuits for making access to these RAMs.

What is claimed is:

1. A semiconductor integrated circuit device formed on a single chip, said semiconductor integrated circuit device comprising:
   a first memory circuit for reading and writing data;
   a second memory circuit for reading and writing data;
   a first logic circuit for generating a first address signal for the read operation of said first memory circuit;
   a second logic circuit for generating a second address signal for the read operation of said second memory circuit;
   a third logic circuit for generating a third address signal for the write operation of said first and second memory circuits;
   a fourth logic circuit for selectively supplying one of said first and third address signals to said first memory circuit;
   a fifth logic circuit for selectively supplying one of said second and third address signals to said second memory circuit;
   a first signal line connected between said first memory circuit and said fourth logic circuit;
   a second signal line connected between said second memory circuit and said fifth logic circuit;
   a third signal line connected between said first logic circuit and said fourth logic circuit, for supplying said first address signal to said fourth logic circuit;
   a fourth signal line connected between said third logic circuit and said fourth logic circuit, for supplying said third address signal to said fourth logic circuit;
   a fifth signal line connected between said second logic circuit and said fifth logic circuit, for supplying said second address signal to said fifth logic circuit; and
   a sixth signal line connected between said third logic circuit and said fifth logic circuit, for supplying said third address signal to said fifth logic circuit;
   wherein the length of said third, fourth, fifth and sixth signal lines is substantially the same.

2. A semiconductor integrated circuit device according to claim 1, wherein said third logic circuit is disposed in an area of said chip between corresponding areas of said first and said second logic circuits.

3. A semiconductor integrated circuit device according to claim 2, wherein said fourth logic circuit is disposed in an area of said chip between the location of an area corresponding to said first memory circuit and areas respectively corresponding to said first and third logic circuits, wherein said fifth logic circuit is disposed in an area between the location of an area corresponding to said second memory circuit and areas respectively corresponding to said second and third logic circuits, and wherein said fourth and fifth logic circuits are disposed adjacently to one another.

4. A semiconductor integrated circuit device, according to claim 3, wherein each of said first and second lines includes first and second groups of signal lines, wherein said first groups of signal lines of each of said first and second signal lines are disposed in symmetrically arranged portions of areas of said chip connecting said fourth and fifth logic circuits to corresponding first portions of said first and second memory circuits, respectively,
   wherein said second groups of signal lines thereof are disposed in symmetrically different portions of areas respectively corresponding to said first and second signal lines, for effecting connections between said third and fourth logic circuits with corresponding second portions of said first and second memory circuits, respectively, said second groups being disposed between said first and second memory circuits and
   wherein the length of said first and second lines are substantially the same.

5. A semiconductor integrated circuit device according to claim 4, which further comprises:
   a sixth logic circuit for supplying data to be written to said first and second memory circuits.

6. A semiconductor integrated circuit device according to claim 5, wherein each of said first and second memory circuits includes a plurality of memory units, and wherein said semiconductor integrated circuit device further comprises:
   a seventh logic circuit for selectively outputting data read out from one of said plurality of memory units contained in said first memory circuit, said seventh logic circuit being disposed on an opposite side to that wherein said first signal line of said first memory circuit is disposed and connected therewith; and an eighth logic circuit for selectively outputting data read out from one of said plurality of memory units contained in said second memory circuit, said eighth logic circuit being disposed on an opposite side to that wherein said second signal line of said second memory circuit is disposed and connected therewith.

7. A semiconductor integrated circuit device according to claim 6, wherein said first, second, third, fourth, fifth, sixth, seventh and eighth logic circuits include first, second, third and fourth bipolar transistors, and wherein the emitters of said first and second bipolar transistors are connected in common to the collector of said third bipolar transistor while the emitters of said third and fourth bipolar transistors are mutually connected.

8. A semiconductor integrated circuit device according to claim 7, wherein said plurality of memory units contained in said first and second memory circuits are static RAMs.

9. A semiconductor integrated circuit device according to claim 8, wherein said first, second and third logic circuits are increment circuits which are updated upon receipt of first, second and third input signals, respectively, and generate said first, second and third address signals, respectively.

10. A semiconductor integrated circuit device according to claim 9, wherein said sixth logic circuit is a latch circuit for latching input data.

11. A semiconductor integrated circuit formed on a single chip, said semiconductor integrated circuit comprising:
a first memory circuit for reading and writing data;
a second memory circuit for reading and writing data;
a first logic circuit disposed on said chip between said first and second memory circuits, for supplying data to be written to said first and second memory circuits;
a second logic circuit for outputting data read out from said first memory circuit;
a third logic circuit for outputting data read out from said second memory circuit;
said first memory circuit being disposed on said chip between said first and second logic circuits;
said second memory circuit being disposed on said chip between said first and third logic circuits;
a third memory circuit for reading and writing data;
a fourth memory circuit for reading and writing data;
a fourth logic circuit disposed between said third and fourth memory circuits, for supplying data to be written to said third and fourth memory circuits;
a fifth logic circuit for outputting data read out from said third memory circuit;
a sixth logic circuit for outputting data read out from said fourth memory circuit;
said third memory circuit being disposed on said chip between said fourth and fifth logic circuits;
said fourth memory circuit being disposed on said chip between said fourth and sixth logic circuits; and
signal lines disposed in spacings between said first and second memory circuits with said third and fourth memory circuits, for supplying address signals to said first, second, third and fourth memory circuits.

12. A semiconductor integrated circuit according to claim 11, wherein said first, second, third, fourth, fifth, and sixth logic circuits contain first, second, third and fourth bipolar transistors; and wherein the emitters of said first and second bipolar transistors are connected in common to the collector of said third bipolar transistor while the emitter of said third bipolar transistor is connected to the emitter of said fourth bipolar transistor.

13. A semiconductor integrated circuit according to claim 12, wherein said first, second, third and fourth memory circuits are static RAMs.

14. A semiconductor integrated circuit according to claim 11, wherein said first and second memory circuits and said first, second and third logic circuits are formed in respective areas as a first horizontally disposed array, and wherein aid third and fourth memory circuits and said fourth, fifth and sixth logic circuits are formed in respective areas as a second horizontally disposed array, said first and second arrays are disposed as a composite symmetrical arrangement such that said first and third memory circuits form one column and said second and fourth arrays form another column.

15. A semiconductor integrated circuit according to claim 14, wherein the areas associated with each of said first through fourth memory circuits and said first through sixth logic circuits on said chip correspond to rectangularshaped areas.

* * * * *